(12) United States Patent
Nanjo et al.

(10) Patent No.: US 12,142,675 B2
(45) Date of Patent: Nov. 12, 2024

(54) SEMICONDUCTOR DEVICE AND METHOD OF MANUFACTURING THE SAME

(71) Applicant: Mitsubishi Electric Corporation, Tokyo (JP)

(72) Inventors: Takuma Nanjo, Tokyo (JP); Akifumi Imai, Tokyo (JP); Tatsuro Watahiki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 360 days.

(21) Appl. No.: 17/616,691

(22) PCT Filed: Nov. 11, 2019

(86) PCT No.: PCT/JP2019/044099
§ 371 (c)(1),
(2) Date: Dec. 6, 2021

(87) PCT Pub. No.: WO2021/024502
PCT Pub. Date: Feb. 11, 2021

(65) Prior Publication Data
US 2022/0199821 A1 Jun. 23, 2022

(30) Foreign Application Priority Data
Aug. 6, 2019 (JP) ................. 2019-144225

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/2003* (2013.01); *H01L 29/432* (2013.01); *H01L 29/66462* (2013.01)

(58) Field of Classification Search
CPC ......... H01L 29/42372-4238; H01L 29/42388; H01L 29/7786; H01L 29/4234; H01L 29/42352; H01L 29/432; H01L 29/66462
See application file for complete search history.

(56) References Cited

U.S. PATENT DOCUMENTS 10,170,611 B1 * 1/2019 Tang ................... H01L 29/7783
2016/0190294 A1   6/2016 Okamoto
(Continued)

FOREIGN PATENT DOCUMENTS

JP    2008-305816 A    12/2008
JP    2010-251456 A    11/2010
(Continued)

OTHER PUBLICATIONS

International Search Report and Written Opinion mailed on Feb. 4, 2020, received for PCT Application PCT/JP2019/044099, Filed on Nov. 11, 2019, 12 pages including English Translation.
(Continued)

*Primary Examiner* — Evan G Clinton
(74) *Attorney, Agent, or Firm* — XSENSUS LLP

(57) ABSTRACT

The present invention relates to a heterojunction field effect transistor, and the heterojunction field effect transistor includes a barrier layer provided in an upper layer portion of a channel layer of a first nitride semiconductor, being formed of a second nitride semiconductor hetero-joined to the first nitride semiconductor, first and second impurity regions provided, being spaced each other with the barrier layer interposed therebetween, a source electrode and a drain electrode which are provided on the first and second impurity regions, respectively, an insulating film which is so provided as to come into contact with at least a region of the barrier layer excluding an edge portion thereof on the side of the source electrode, a gate insulating film which is in contact with the edge portion of the barrier layer and covers (Continued)

the insulating film, and a gate electrode which is so provided on the gate insulating film.

13 Claims, 24 Drawing Sheets

(51) Int. Cl.
*H01L 29/43* (2006.01)
*H01L 29/66* (2006.01)

(56) References Cited

U.S. PATENT DOCUMENTS

| | | | |
|---|---|---|---|
| 2016/0315180 A1* | 10/2016 | Tanaka | H01L 29/7786 |
| 2017/0047437 A1* | 2/2017 | Nakayama | H01L 21/2258 |
| 2017/0358652 A1 | 12/2017 | Okamoto | |
| 2020/0161462 A1* | 5/2020 | Iucolano | H01L 29/7838 |

FOREIGN PATENT DOCUMENTS

| | | | | |
|---|---|---|---|---|
| JP | 2012-69662 A | 4/2012 | | |
| JP | 2014-45174 A | 3/2014 | | |
| JP | 2016-127082 A | 7/2016 | | |
| JP | 2017-37982 A | 2/2017 | | |
| JP | 2017-208556 A | 11/2017 | | |
| WO | 2018/037530 A1 | 3/2018 | | |
| WO | WO-2018220741 A1 * | 12/2018 | ....... | H01L 21/28264 |

OTHER PUBLICATIONS

Oishi et al., "Highly Resistive GaN Layers Formed by Ion Implantation of Zn Along the c Axis", Journal of Applied Physics, Aug. 1, 2003, vol. 94, No. 3, pp. 1662-1666.

Office Action issued Aug. 24, 2023, in corresponding German Application No. 11 2019 007 609.4, 18pp.

* cited by examiner

F I G. 7
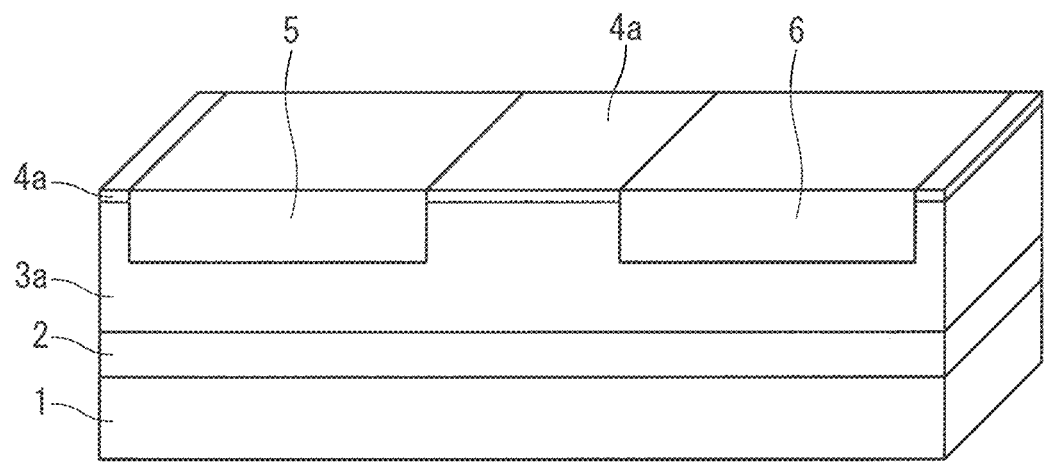
F I G. 8
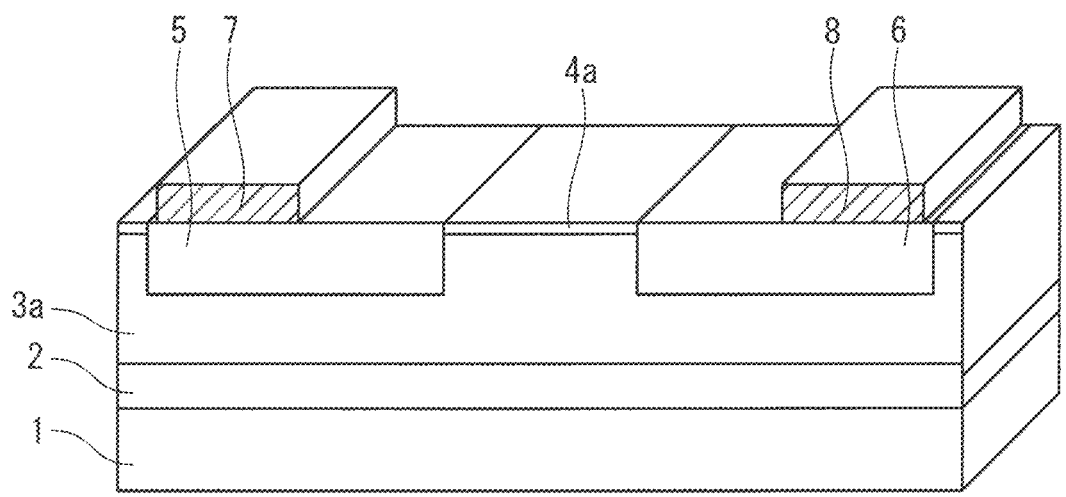

F I G. 15
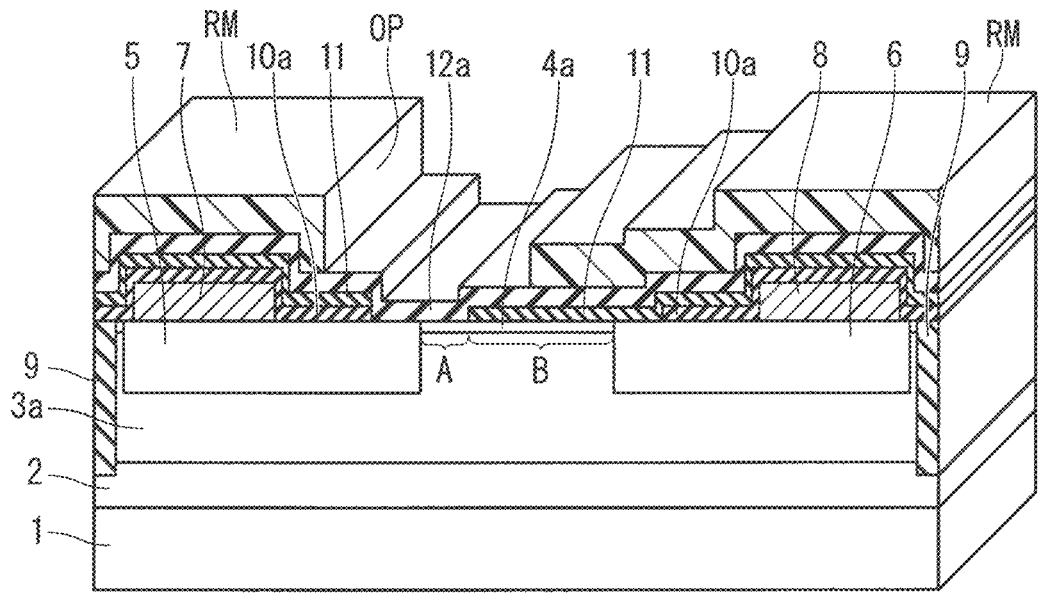
F I G. 16
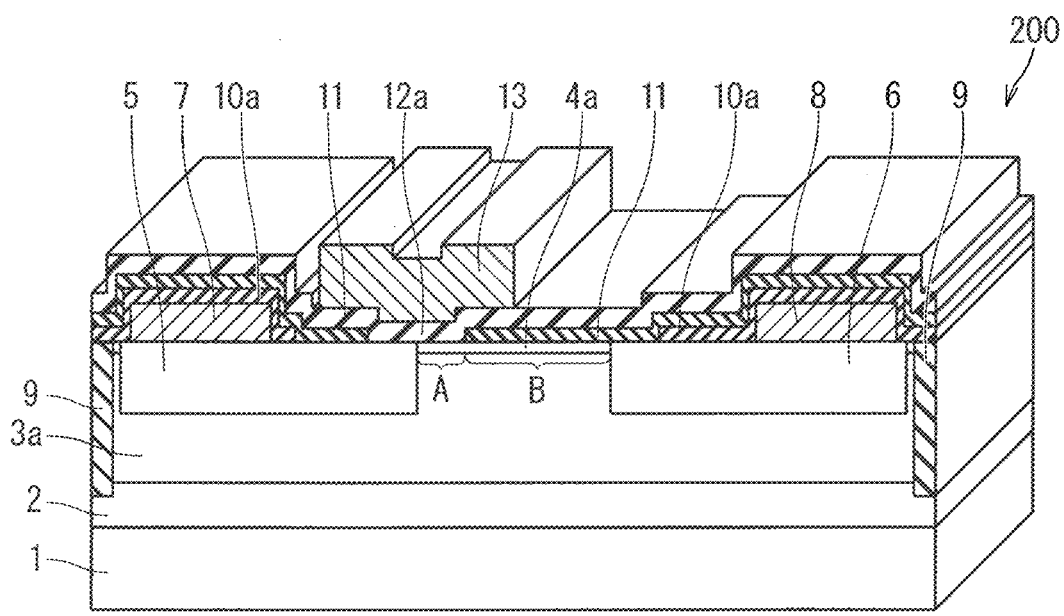

F I G. 4 5
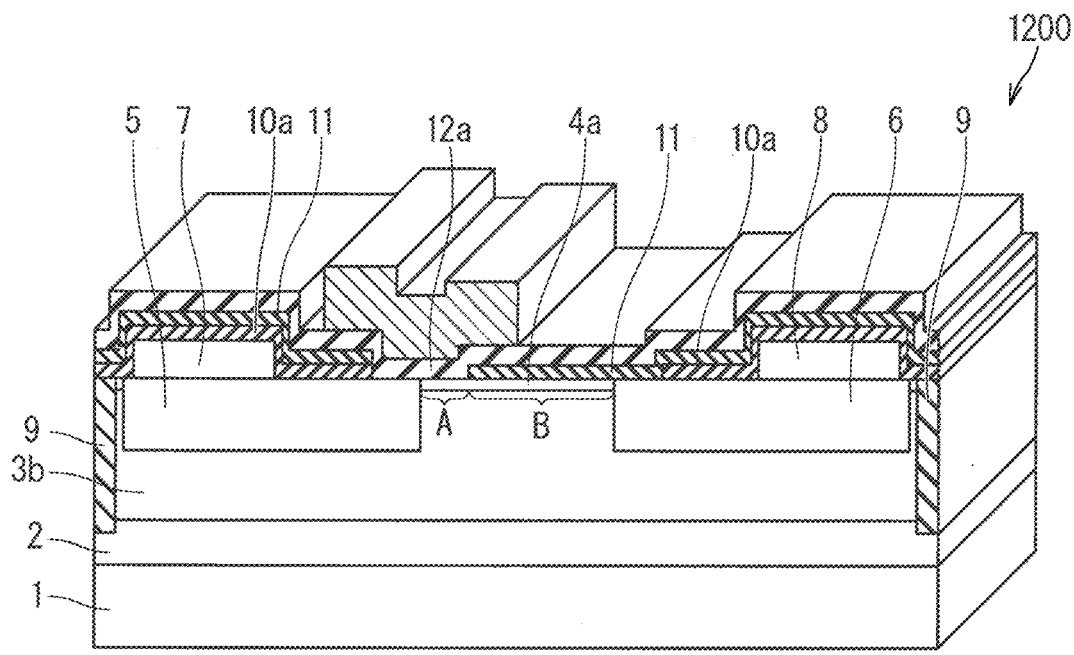
F I G. 4 6
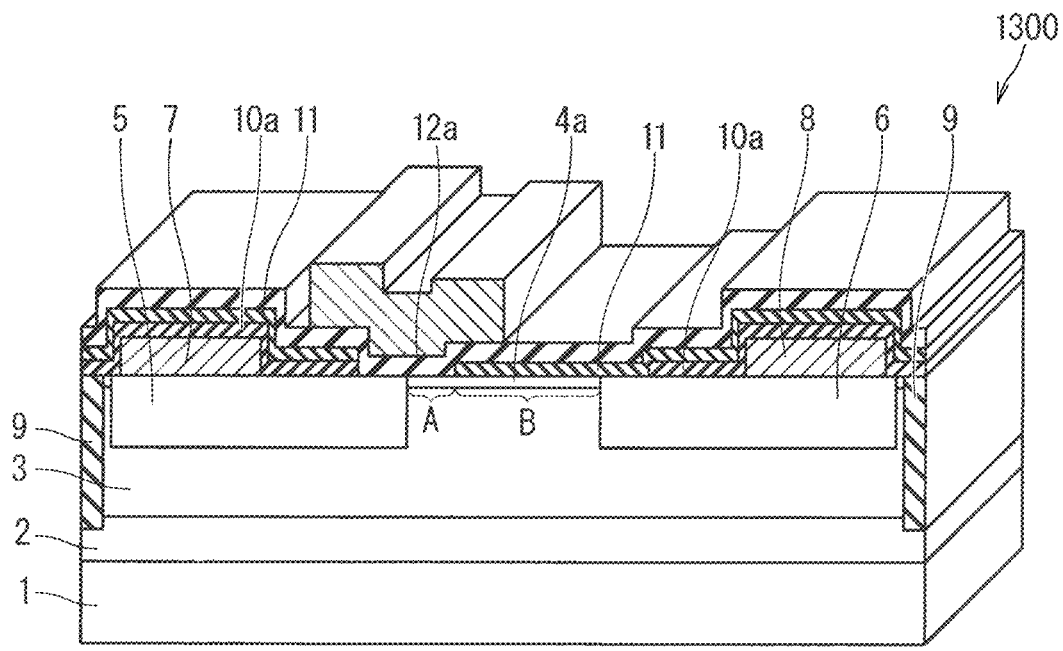

SEMICONDUCTOR DEVICE AND METHOD OF MANUFACTURING THE SAME

CROSS-REFERENCE TO RELATED APPLICATIONS

The present application is based on PCT filing PCT/JP2019/044099, filed Nov. 11, 2019, which claims priority to JP 2019-144225, filed Aug. 6, 2019, the entire contents of each are incorporated herein by reference.

TECHNICAL FIELD

The present invention relates to a semiconductor device, and more particularly to a heterojunction field effect transistor formed of a semiconductor containing a nitride.

BACKGROUND ART

A conventional field effect transistor formed of a semiconductor (nitride semiconductor) containing a nitride is a heterojunction field effect transistor formed of a nitride semiconductor, which is disclosed in, for example, Patent Document 1. In the heterojunction field effect transistor, a channel layer of GaN (gallium nitride) and a barrier layer of AlGaN (aluminum gallium nitride) are formed on a substrate in this order, and a source electrode, a drain electrode, and a gate electrode are formed thereon. In the channel layer and the barrier layer below the source electrode and the drain electrode, high-concentration n-type impurity regions are formed, and on the barrier layer of AlN sandwiched by the high-concentration n-type impurity regions, a gate insulating film of $AlGa_xO_y$ (aluminum gallium oxide) is so formed as to cover the region and the gate electrode is formed thereon.

PRIOR ART DOCUMENTS

Patent Documents

[Patent Document 1] Japanese Patent Application Laid Open Gazette No. 2008-305816

SUMMARY

Problem to be Solved by the Invention

A normally-off operation required in a case where the heterojunction field effect transistor formed of the nitride semiconductor is used as a switching element can be achieved by the structure disclosed in Patent Document 1. In the above-described structure in which the high-concentration n-type impurity region is formed in the semiconductor layer ranging from a lower portion of the gate electrode to a lower portion of the drain electrode, however, almost all the voltage applied between the gate electrode and the drain electrode is imposed on the gate electrode and the gate insulating film. Therefore, an upper limit of the voltage (breakdown voltage) which can be applied between the gate electrode and the drain electrode depends only on the breakdown voltage of the gate insulating film and cannot be made sufficiently high.

The present invention is intended to solve the above-described problem, and it is an object of the present invention to provide a heterojunction field effect transistor in which a higher voltage can be applied between a gate electrode and a drain electrode.

Means to Solve the Problem

A semiconductor device according to the present invention includes: a substrate; a channel layer provided on the substrate, being formed of a first nitride semiconductor; a barrier layer provided in an upper layer portion of the channel layer, being formed of a second nitride semiconductor having a bandgap larger than that of the first nitride semiconductor; a first impurity region of n-type and a second impurity region of n-type which are provided in the upper layer portion of the channel layer, being spaced each other with the barrier layer interposed therebetween; a source electrode and a drain electrode which are provided on the first impurity region and the second impurity region, respectively; a drift region in which an insulating film is provided as to come into contact with the barrier layer on the barrier layer excluding an edge portion of the barrier layer on the side of the source electrode; a channel region on which the insulating film is not formed, at an edge portion of the barrier layer and at a position away from the second impurity region; a gate insulating film formed so as to come into contact with the barrier layer and the insulating film respectively on the channel region and the drift region; and a gate electrode which is provided on the channel region and the gate insulating film on a part of the drift region. The barrier layer in the channel region and the drift region has an identical thickness and composition. A sheet resistance due to a two-dimensional electron gas generated in an interface between the channel layer and the barrier layer in the channel region is greater than or equal to 10 kΩ/sq. The sheet resistance due to the two-dimensional electron gas generated in the interface between the channel layer and the barrier layer in the drift region is less than or equal to 10 kΩ/sq.

Effects of the Invention

In the semiconductor device according to the present invention, the two-dimensional electron gas (2DEG) in a heterointerface between the channel layer and the barrier layer in the channel region and the drift region increases. Since the two-dimensional electron gas is depleted when a high voltage is applied to the drain electrode, the applied voltage is imposed not only on the gate insulating film but also on this region, and it thereby becomes possible to apply a higher voltage between the gate electrode and the drain electrode.

BRIEF DESCRIPTION OF DRAWINGS

FIG. 7 is a view showing the method of manufacturing the semiconductor device of the first preferred embodiment in accordance with the present invention;

FIG. 8 is a view showing the method of manufacturing the semiconductor device of the first preferred embodiment in accordance with the present invention;

FIG. 15 is a view showing the method of manufacturing the semiconductor device of the first preferred embodiment in accordance with the present invention;

FIG. 16 is a perspective view showing a cross-section structure of a semiconductor device of a second preferred embodiment in accordance with the present invention;

FIG. 45 is a perspective view showing a cross-section structure of a semiconductor device of a twelfth preferred embodiment in accordance with the present invention;

FIG. 46 is a perspective view showing a cross-section structure of a semiconductor device of a thirteenth preferred embodiment in accordance with the present invention;

DESCRIPTION OF EMBODIMENT(S)

The First Preferred Embodiment

<Device Configuration>

Figure 1:
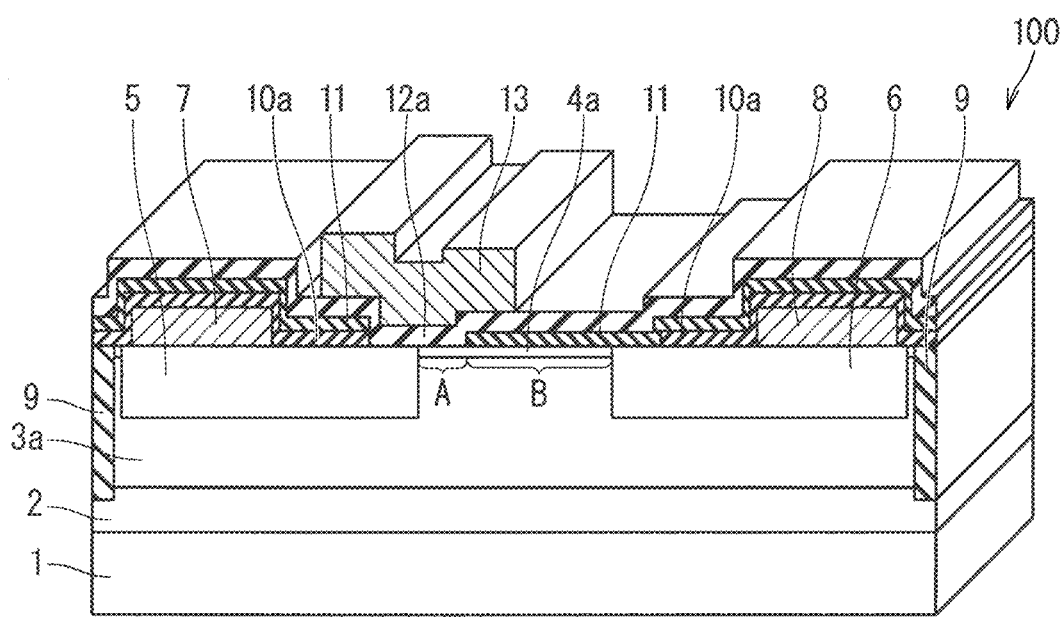
FIG. 1 is a perspective view showing a cross-section structure of a semiconductor device of a first preferred embodiment in accordance with the present invention.

FIG. 1 is a perspective view showing a cross-section structure of a heterojunction field effect transistor 100 formed of a nitride semiconductor of the first preferred embodiment in accordance with the present invention.

As shown in FIG. 1, in the heterojunction field effect transistor 100, on a substrate 1 formed of, for example, silicon carbide (SiC), a channel layer 3a formed of non-doped GaN (first nitride semiconductor) is laminated with a buffer layer 2 formed of AlN (aluminum nitride) interposed therebetween, and in an upper layer portion of the channel layer 3a, a high-concentration n-type impurity region 5 (first impurity region) and a high-concentration n-type impurity region 6 (second impurity region) which each have high-concentration n-type impurity are selectively formed, being spaced each other. In the upper layer portion of the channel layer 3a between the high-concentration n-type impurity regions 5 and 6, provided is a barrier layer 4a formed of non-doped AlGaN (second nitride semiconductor) which forms a heterojunction with the channel layer 3a.

On partial regions of the high-concentration n-type impurity regions 5 and 6, a source electrode 7 and a drain electrode 8 are formed, respectively, being spaced each other.

Outside respective edge portions of the high-concentration n-type impurity regions 5 and 6 on the opposite side of the barrier layer 4a, provided are isolation regions 9 reaching from an outermost surface of the barrier layer 4a into the buffer layer 2. The isolation region 9 is formed by ion implantation of zinc (Zn).

A cap insulating film 10a formed of SiN$_a$ (silicon nitride) is so formed as to cover the source electrode 7 and a partial region of the high-concentration n-type impurity region 5 which is adjacent to the source electrode 7. Further, another cap insulating film 10a is so formed as to cover the drain electrode 8 and a partial region of the high-concentration n-type impurity region 6 which is adjacent to the drain electrode 8.

On the side of the high-concentration n-type impurity region 6, an electron supply insulating film 11 (silicon oxide film) formed of SiO$_b$ (silicon oxide) is so formed as to cover a range from the cap insulating film 10a to a portion of the high-concentration n-type impurity region 6 which is not covered with the cap insulating film 10a and a partial region of the barrier layer 4a. Further, on the side of the high-concentration n-type impurity region 5, the electron supply insulating film 11 is so formed as to cover the cap insulating film 10a. In other words, the electron supply insulating film 11 is formed so that a partial region of the barrier layer 4a on the side of the high-concentration n-type impurity region 5 and a partial region of the high-concentration n-type impurity region 5 which is adjacent thereto may become an opening.

Furthermore, a gate insulating film 12a formed of AlO$_c$ (aluminum oxide) is so formed as to cover an entire region including the source electrode 7 and the drain electrode 8.

A gate electrode 13 is so formed as to cover the gate insulating film 12a extending from a partial portion on the electron supply insulating film 11 on the side of the source electrode 7 to a partial portion on the electron supply insulating film 11 formed on the side of the drain electrode.

In the heterojunction field effect transistor 100 shown in FIG. 1, the channel layer 3a and the barrier layer 4a, except a region in which the high-concentration n-type impurity region 5, the high-concentration n-type impurity region 6, and the isolation region 9 are formed, are formed of non-doped GaN and non-doped AlGaN, respectively. Specifically, it is designed that the doping amount of elements other than major elements (Al, Ga, and N) forming these layers should be at least less than or equal to $1 \times 10^{17}$ cm$^{-3}$.

Further, in a state where only the barrier layer 4a is formed on the channel layer 3a, i.e., a state where none of the high-concentration n-type impurity region 5, the high-concentration n-type impurity region 6, the isolation region 9, the source electrode 7, the drain electrode 8, the cap insulating film 10a, the electron supply insulating film 11, the gate insulating film 12a, and the gate electrode 13 is formed, the Al composition and the thickness of the barrier layer 4a are designed that a sheet resistance Rs$_{ch}$ due to a 2DEG (two-dimensional electron gas) generated in an interface between the channel layer 3a and the barrier layer 4a should have a sufficiently high value, i.e., should be at least greater than or equal to 1 kΩ/sq. In a case, for example, where the Al composition and the thickness of the barrier layer 4a of AlGaN are 15% and 7 nm, where 20% and 5 nm, and where 100% and 1 nm, respectively, the sheet resistance Rs$_{ch}$ is greater than or equal to 10 kΩ/sq. When the sheet resistance Rs$_{ch}$ takes such a value, a drain current value in an OFF state of the transistor is a sufficiently low value to the extent that there is no problem in the operation, for example, less than or equal to 1 microampere (μA). Furthermore, the sheet resistance Rs$_{ch}$ in the above-described state where only the barrier layer 4a is formed on the channel layer 3a is defined as an intrinsic sheet resistance.

Further, in the high-concentration n-type impurity region 5 and the high-concentration n-type impurity region 6, the doping concentration and the thickness thereof are designed so that a sheet resistance Rs$_{nd}$ in these regions may take such a value as to make the drain current value in an ON state of the transistor a sufficiently low value to the extent that there is no problem in the operation, i.e., may take at least less than or equal to 1 kΩ/sq. When dopants of Si and Ge serving as donors for AlGaN and GaN are doped with an implantation dose amount of $1 \times 10^{15}$ cm$^{-2}$, for example, the sheet resistance Rs$_{nd}$ becomes less than or equal to 1 kΩ/sq.

By adopting such a structure, the following effects can be produced. Specifically, an upper surface of the barrier layer 4a sandwiched between the high-concentration n-type impurity region 5 and the high-concentration n-type impurity region 6 is in contact with the gate insulating film 12a on the side of the source electrode 7 and in contact with the electron supply insulating film 11 on the side of the drain electrode 8. In other words, a channel region A where the barrier layer 4a is in contact with the gate insulating film 12a and a drift region B where the barrier layer 4a is in contact with the electron supply insulating film 11 are different from each other in the kind of insulating film in contact with the barrier layer 4a. Since a large amount of positive electric charges are induced in an interface between SiO$_b$ (the electron supply insulating film 11) and AlGaN, the 2DEG in the interface between the barrier layer 4a and the channel layer 3a increases in the drift region B, and it becomes possible to reduce a sheet resistance Rs$_{dr}$ due to the 2DEG generated in the interface between the channel layer 3a and the barrier layer 4a in the drift region B to less than or equal to 10 kΩ/sq. This will be described later in detail.

On the other hand, since the positive electric charge is harder to be induced in an interface between $AlO_c$ (the gate insulating film 12a) and AlGaN than in the interface between $SiO_b$ (the electron supply insulating film 11) and AlGaN, the 2DEG generated in the interface between the channel layer 3a and the barrier layer 4a does not increase in the channel region A, and it is possible to keep the sheet resistance $Rs_{ch}$ to a sufficiently high value, i.e., to at least greater than or equal to 10 kΩ/sq. This will be described later in detail.

In such a structure, by changing a voltage (gate voltage) to be applied to the gate electrode 13 with the source electrode 7 as a reference potential (being grounded), it is possible to control the concentration of the 2DEG generated in the interface between the barrier layer 4a and the channel layer 3a in the channel region A. In other words, in a case where no gate voltage is applied or where the gate voltage is negative, the concentration of the 2DEG is kept sufficiently low, and even if a positive voltage (drain voltage) is applied to the drain electrode 8, no current (drain current) is carried in the drain electrode 8. On the other hand, in a case where the gate voltage is positive, since the concentration of the 2DEG becomes high and the resistance of the entire region from the source electrode 7 to the drain electrode 8 becomes sufficiently low, a large drain current can be obtained when a positive voltage is applied to the drain electrode 8. In other words, as a transistor, a normally-off operation can be achieved. Further, in a state where no gate voltage is applied or where a negative voltage is applied (in an OFF state), when the drain voltage is made higher, the 2DEG generated between the barrier layer 4a and the channel layer 3a in the drift region B is depleted and a depletion layer thereby extends also in the drift region B. Therefore, since the voltage applied between the gate electrode 13 and the drain electrode 8 is dispersed not only in the gate insulating film 12a but also in the drift region B, it consequently becomes possible to apply a high drain voltage, and a breakdown voltage in an OFF time becomes high and a high voltage operation of the transistor can be performed.

Furthermore, in the heterojunction field effect transistor 100, in the drift region B below the gate electrode 13 on the side of the drain electrode 8 from the channel region A, the gate electrode 13 is formed above the barrier layer 4a with the electron supply insulating film 11 and the gate insulating film 12a interposed therebetween in this order.

By adopting such a structure, it becomes possible to relieve the electric field concentrated at an end portion of the gate electrode 13 on the side of the drain electrode 8 at the time when a high voltage is applied to the drain electrode 8 and further possible to apply a higher voltage thereto. Further, it becomes possible to suppress occurrence of current collapse in which an ON-resistance transiently increases due to the electric field concentration.

Furthermore, in the heterojunction field effect transistor 100, in a region below the gate electrode 13 on the side of the source electrode 7 from the channel region A, the gate electrode 13 is formed above the high-concentration n-type impurity region 5 with the cap insulating film 10a of $SiN_a$, the electron supply insulating film 11 of $SiO_b$, and the gate insulating film 12a of $AlO_c$ interposed therebetween in this order.

By adopting such a structure, it becomes possible to relieve the electric field concentrated at an end portion of the gate electrode 13 on the side of the source electrode 7 at the time when a voltage is applied to the drain electrode 8, and further possible to suppress occurrence of the current collapse due to the electric field concentration.

Further, in the heterojunction field effect transistor 100, since the source electrode 7 and the drain electrode 8 are covered with the cap insulating film 10a, it is possible to prevent degradation of the source electrode 7 and the drain electrode 8 due to oxidation and suppress an increase in the ON-resistance.

Furthermore, in the heterojunction field effect transistor 100, as described above, since the electron supply insulating film 11 is formed on the barrier layer 4a in the drift region B and due to the positive electric charge generated in the interface, the 2DEG in the interface between the barrier layer 4a and the channel layer 3a in this region is increased, both the normally-off operation and an increase in the breakdown voltage can be achieved. Therefore, without doping some impurity into the barrier layer 4a and the channel layer 3a in the channel region A and the drift region B, both the normally-off operation and the increase in the breakdown voltage can be achieved.

Since the impurity doped into the barrier layer 4a and the channel layer 3a forms a deep energy level inside a bandgap in the nitride semiconductor and this becomes a trap level to induce the current collapse, when the doping concentration of the impurity into the barrier layer 4a and the channel layer 3a is kept sufficiently low, it becomes possible to suppress occurrence of the current collapse due to the trap level which is thereby formed.

When level density is sufficiently lower than carrier density in a transistor operation, the effect of such a trap level on the current collapse is negligible, but when the level density is almost the same as the carrier density, the effect is not negligible. In the heterojunction field effect transistor using the nitride semiconductor, since the 2DEG of at least $1 \times 10^{12}$ cm$^{-2}$ or more is generally used as a carrier, if the ratio is 1% or less when the effect on the current collapse is almost negligible, the trap level density has only to be less than or equal to $1 \times 10^{10}$ cm$^{-2}$. Since the thickness of the barrier layer 4a needs to be less than or equal to 10 nm in order to achieve the above-described design value of the sheet resistance, if the doping amount in the barrier layer 4a is less than or equal to $1 \times 10^{16}$ cm$^{-3}$, the effect on the current collapse can be negligible.

Next, a result of verifying a phenomenon in the above-described drift region B in which the electron supply insulating film 11 is formed on the barrier layer 4a and the 2DEG generated in the interface between the channel layer 3a and the barrier layer 4a is thereby increased, to thereby reduce the sheet resistance $Rs_{ch}$, will be described below.

Figure 2:
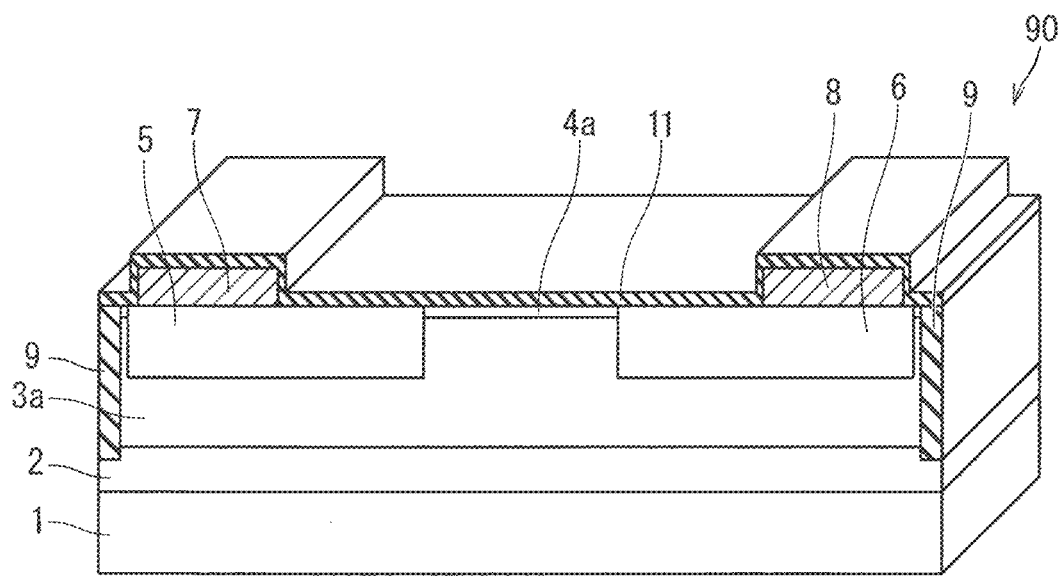
FIG. 2 is a perspective view showing a cross-section structure of a sample used for a verification.

FIG. 2 is a perspective view showing a cross-section structure of a sample 90 used for the verification. In the sample 90, constituent elements identical to those in the heterojunction field effect transistor 100 shown in FIG. 1 are represented by the same reference signs, and redundant description will be omitted.

In the sample 90, constituent elements in the structure ranging from the substrate 1 to the source electrode 7 and the drain electrode 8 are identical to those in the heterojunction field effect transistor 100, and the electron supply insulating film 11 is so formed as to cover respective surfaces of the source electrode 7 and the drain electrode 8, the high-concentration n-type impurity regions 5 and 6 which are not covered with the source electrode 7 or the drain electrode 8, respectively, and the barrier layer 4a.

Hereinafter, a method of producing the sample 90 will be described. On the substrate 1 of SiC, the buffer layer 2, the channel layer 3a, and the barrier layer 4a are grown in this order by the MOCVD (metal organic chemical vapor deposition) method. In this verification, as the barrier layer 4a, used are two types of structures where the Al composition and the thickness thereof are 15% and 7 nm and where 20% and 5 nm, respectively.

Subsequently, Si ions are implanted into a desired region by the ion implantation method using a resist pattern as a mask under the conditions with an implantation dose amount of $1 \times 10^{15}$ cm$^{-2}$ and an implantation energy of 50 keV, and then a heat treatment is performed by the RTA (rapid thermal annealing) method in a nitrogen atmosphere at 1150° C. for five minutes and the doped Si ions are activated, to thereby form the high-concentration n-type impurity regions 5 and 6.

Subsequently, the source electrode 7 and the drain electrode 8 each formed of a multilayer film of metals are formed by using vapor deposition and the lift-off method.

Subsequently, Zn ions are implanted into the channel layer 3a and the barrier layer 4a in a region outside the high-concentration n-type impurity region 5 and the high-concentration n-type impurity region 6 by the ion implantation method, to thereby form the isolation regions 9.

Subsequently, the electron supply insulating film 11 having a thickness of 10 nm is so formed by using the plasma CVD method as to cover the entire region including the barrier layer 4a sandwiched between the high-concentration n-type impurity regions 5 and 6. Further, after the electron supply insulating film 11 is formed, a heat treatment is performed in nitrogen at 300 to 950° C. for 30 seconds, to thereby form the sample 90.

Figure 3:
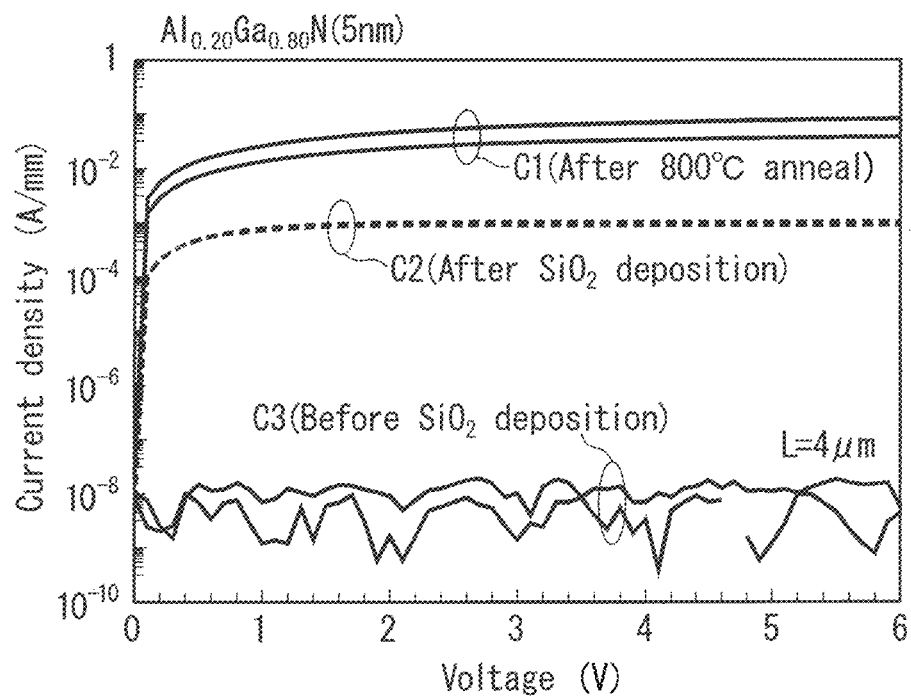
FIG. 3 is a graph showing current-voltage (I-V) characteristics measured between a source electrode and a drain electrode in the sample used for the verification.
Figure 4:
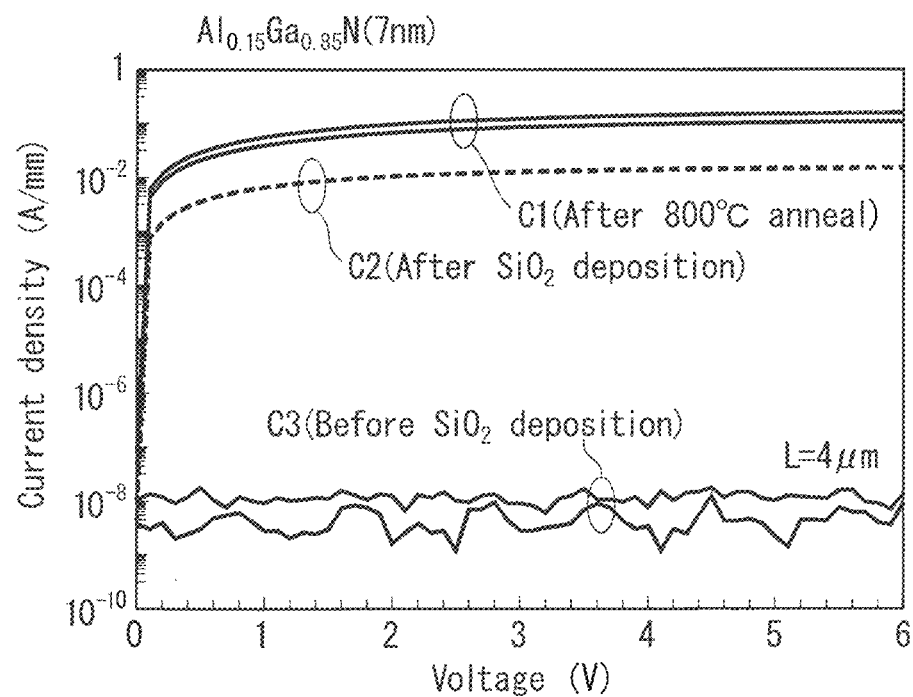
FIG. 4 is a graph showing current-voltage (I-V) characteristics measured between the source electrode and the drain electrode in the sample used for the verification.

FIGS. 3 and 4 each show current-voltage (I-V) characteristics measured between the source electrode 7 and the drain electrode 8 in the sample 90 shown in FIG. 2, wherein the horizontal axis represents the voltage (V) and the vertical axis represents the current density (A/mm).

FIGS. 3 and 4 each show a measurement result C3 (Before $SiO_2$ deposition) before forming the electron supply insulating film 11, a measurement result C2 (After $SiO_2$ deposition) after forming the electron supply insulating film 11, and a measurement result C1 (After 800° C. anneal) after performing a heat treatment at 800° C. Further, since two samples are produced on the same substrate and measurement is performed thereon, two characteristics are shown in any one measurement result.

It is assumed that the width of each of the high-concentration n-type impurity regions 5 and 6 is 100 μm and the distance between the high-concentration n-type impurity regions 5 and 6 is 4 μm (L=4 μm). Further, FIG. 3 shows the characteristics in the case where the Al composition and the thickness are 20% and 5 nm, respectively, and FIG. 4 shows the characteristics in the case where the Al composition and the thickness are 15% and 7 nm, respectively.

As can be seen from FIGS. 3 and 4, both in the cases where the Al composition of the barrier layer 4a is 20% and where the Al composition thereof is 15%, the current density is $1 \times 10^{-8}$ A/mm before forming the electron supply insulating film 11. Since the measurement limit value of a measuring device used for the measurement is $1 \times 10^{-8}$ A/mm, the current value in a state before the electron supply insulating film 11 is formed is at least less than or equal to $1 \times 10^{-8}$ A/mm.

After forming the electron supply insulating film 11, in both cases of the Al compositions, the current value increases significantly (by four digits or more). Furthermore, after performing the heat treatment at 800° C., the current value further increases and can take a value of about 0.1 A/mm in both cases of the Al compositions.

From these results, in the case where the electron supply insulating film 11 ($SiO_b$) is formed on the barrier layer 4a (AlGaN), it is experimentally verified that the 2DEG generated in the interface between the channel layer 3a and the barrier layer 4a increases and the sheet resistance is thereby reduced. This results from the phenomenon in which a large amount of positive electric charges are induced in the interface between $SiO_b$ and AlGaN. Since the sheet resistance is reduced and the current value is increased by providing the electron supply insulating film 11, the insulating film formed of $SiO_b$ is referred to as an electron supply insulating film.

Further, the reason why the electron supply insulating film 11 is represented as $SiO_b$ is that this is a compound of Si (silicon) and O (oxygen) but is a deposited film, and therefore the composition is not always represented as general-type "$SiO_2$". The same applies to $SiN_a$, $AlO_c$, and the like.

Figure 5:
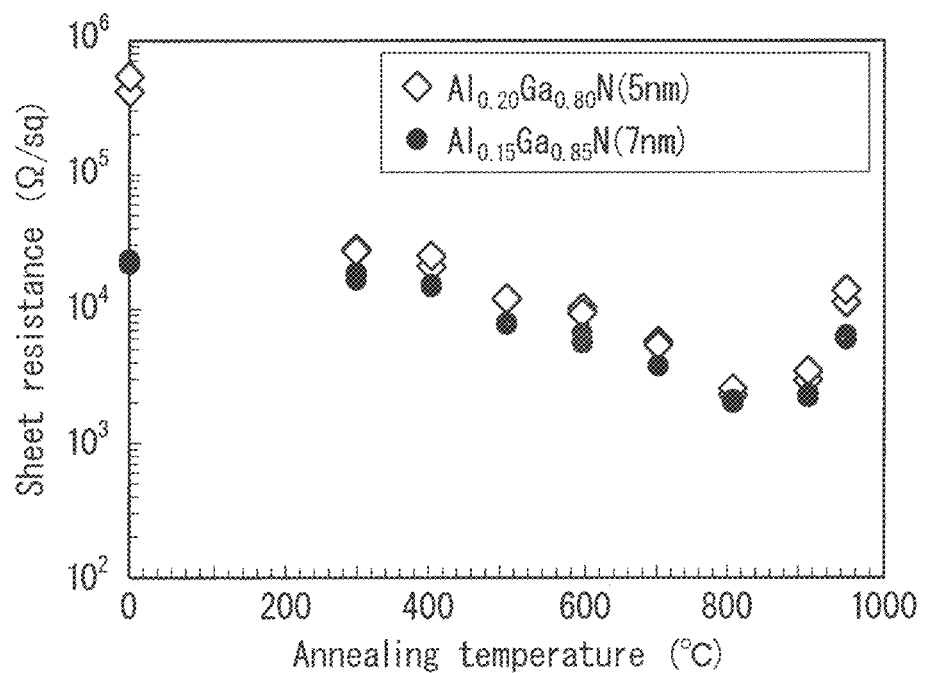
FIG. 5 is a graph showing heat treatment temperature dependence of a sheet resistance in the sample used for the verification.

Furthermore, FIG. 5 shows heat treatment temperature dependence of the sheet resistance obtained from the I-V characteristics which is measured by using different patterns in a range of the distance between the high-concentration n-type impurity regions 5 and 6 from 2 to 20 μm.

In FIG. 5, the horizontal axis represents the annealing temperature (° C.) and the vertical axis represents the sheet resistance (Ω/sq), and the characteristics in the case where the Al composition and the thickness are 20% and 5 nm, respectively, are represented by ◇, and those in the case where the Al composition and the thickness are 15% and 7 nm, respectively, are represented by ●.

From FIG. 5, it is verified that the sheet resistance is reduced by performing the heat treatment after the electron supply insulating film 11 is formed, and further reduced to less than or equal to 10 kΩ/sq by performing the heat treatment at 500 to 950° C. This results from an increase in the positive electric charge induced in the interface between $SiO_b$ and AlGaN, which is caused by the heat treatment.

As described above, in the heterojunction field effect transistor 100 of the first preferred embodiment, both the normally-off operation and a high breakdown voltage operation can be achieved.

<Manufacturing Method>

Next, an exemplary method of manufacturing the heterojunction field effect transistor 100 will be described with reference to FIGS. 6 to 15 showing the manufacturing process steps in order. Further, in FIGS. 6 to 15, constituent elements identical to those in the heterojunction field effect transistor 100 shown in FIG. 1 are represented by the same reference signs, and redundant description will be omitted.

Figure 6:
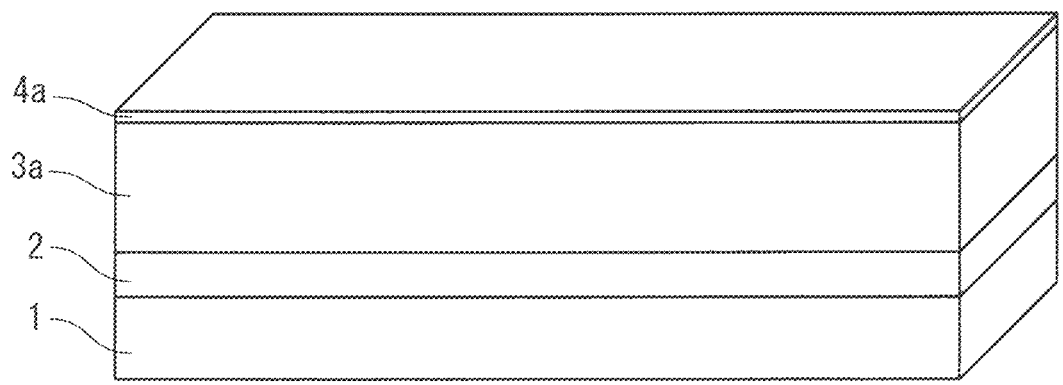
FIG. 6 is a view showing a method of manufacturing the semiconductor device of the first preferred embodiment in accordance with the present invention.

First, in the process step of FIG. 6, on the substrate 1 of SiC, the buffer layer 2 of AlN, the channel layer 3a of GaN, and the barrier layer 4a of AlGaN are grown in this order by using the MOCVD method or the epitaxial growth method such as the MBE (molecular beam epitaxy) method or the like.

Next, in the process step of FIG. 7, ions such as Si or the like, which are to become an n-type impurity in the nitride semiconductor, are doped into a desired region by the ion implantation method or the like using a resist pattern or the like as a mask under the conditions with an implantation dose amount of $1 \times 10^{13}$ to $1 \times 10^{16}$ cm$^{-2}$ and an implantation energy of 10 to 1000 keV. After that, a heat treatment is performed by using, for example, the RTA method or the like in the nitrogen atmosphere at 800 to 1500° C. and the doped ions are activated, to thereby form the high-concentration n-type impurity region 5 and the high-concentration n-type impurity region 6.

Next, in the process step of FIG. 8, a multilayer film of metals is deposited on a desired region by vapor deposition and the lift-off method, and after that, a heat treatment is performed at 500 to 900° C. by using the RTA method or the like and the deposited multilayer film is alloyed, to thereby form the source electrode 7 and the drain electrode 8. As the multilayer film of metals, for example, a multilayer film of Ti (titanium) and Al can be used, but in a case where the multilayer film is formed on the high-concentration n-type impurity region, any metals which are general-type metals to be each used as an electrode can obtain an ohmic contact, and therefore the metals to be used are not particularly restricted.

Figure 9:
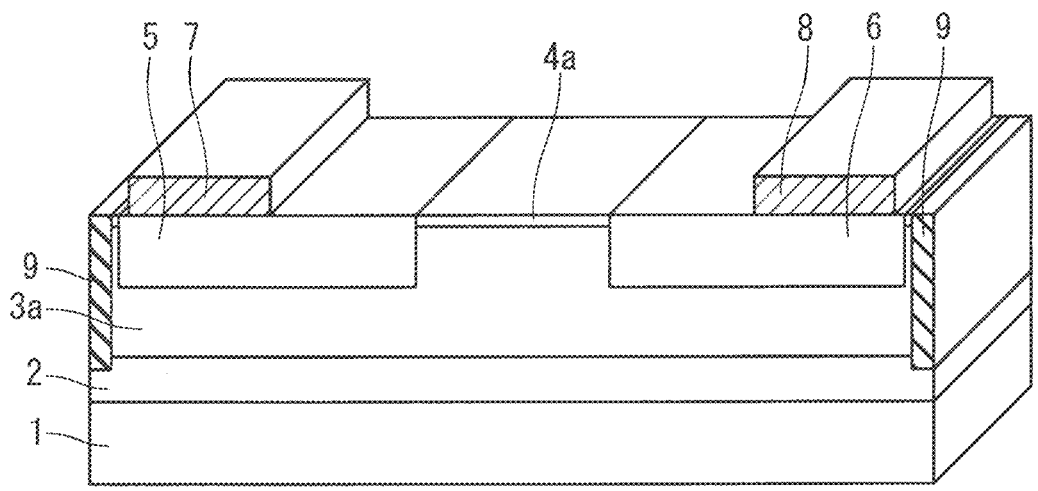
FIG. 9 is a view showing the method of manufacturing the semiconductor device of the first preferred embodiment in accordance with the present invention.

Next, in the process step of FIG. 9, Zn ions are implanted outside a region in which the transistor is to be manufactured, by using the ion implantation method, to thereby form the isolation region 9 reaching from the outermost surface of the barrier layer 4a into the buffer layer 2. Further, the technique for increasing the resistance of GaN by implanting Zn ions is well known and disclosed in, for example, "Toshiyuki Oishi, Naruhisa Miura, Muneyoshi Suita, Takuma Nanjo, Yuji Abe, and Tatsuo Ozeki, J. Appl. Phys. Vol. 94, No. 3, 1662-1666 (2003)".

Figure 10:
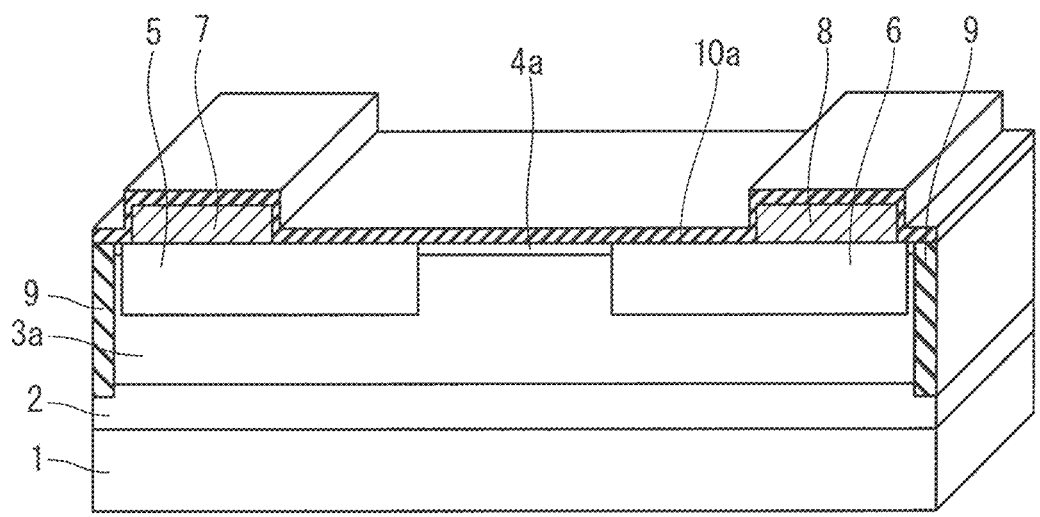
FIG. 10 is a view showing the method of manufacturing the semiconductor device of the first preferred embodiment in accordance with the present invention.

Next, in the process step of FIG. 10, on the channel layer 3a in which the source electrode 7 and the drain electrode 8 are formed, the cap insulating film 10a formed of $SiN_a$ is deposited by using, for example, the plasma CVD method.

Figure 11:
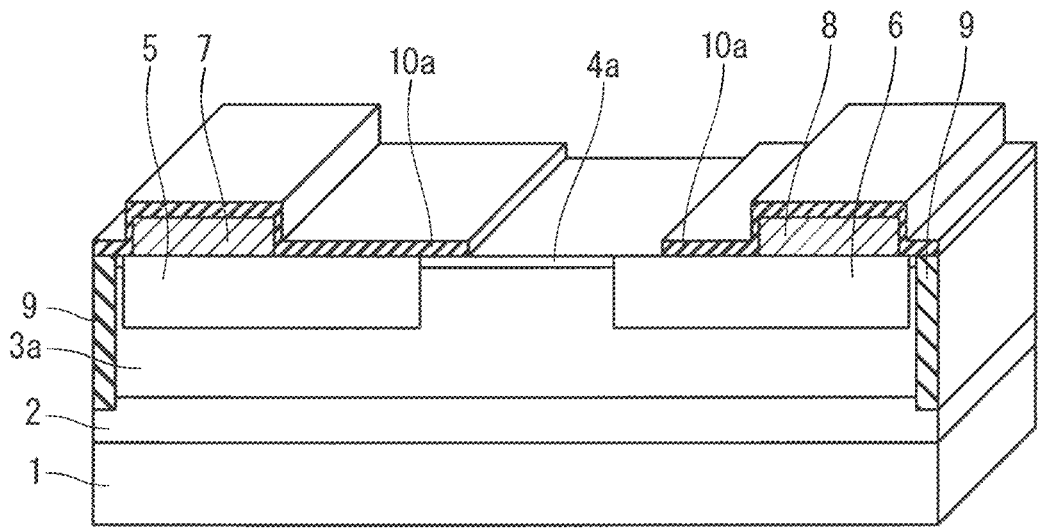
FIG. 11 is a view showing the method of manufacturing the semiconductor device of the first preferred embodiment in accordance with the present invention.

Next, in the process step of FIG. 11, the cap insulating film 10a in a desired region is removed by the wet etching method using buffered hydrofluoric acid or the like with a resist pattern or the like as a mask. The region to be removed is a region ranging from a partial portion on the barrier layer 4a to a portion on the edge portion of the high-concentration n-type impurity region 6 adjacent to the barrier layer 4a.

Figure 12:
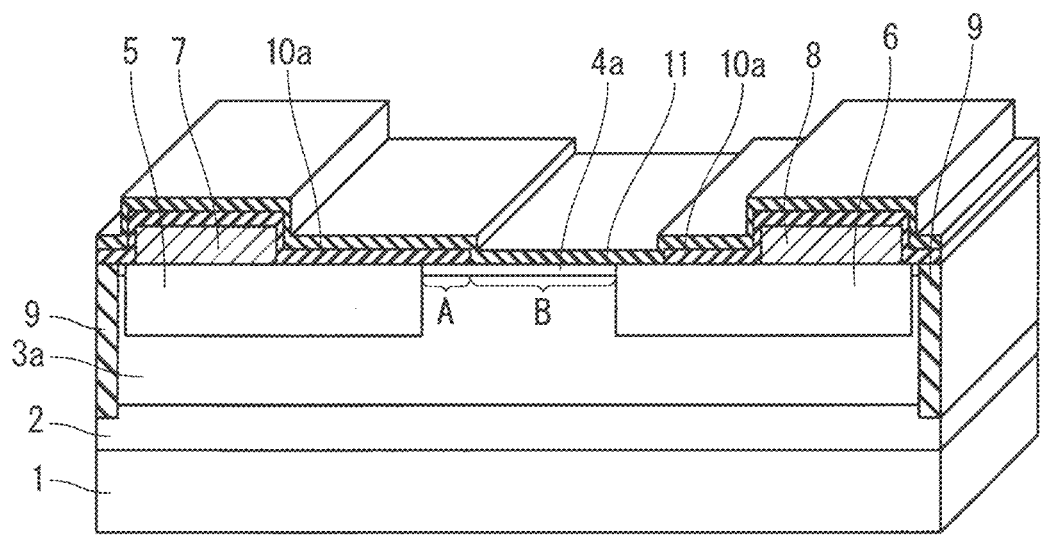
FIG. 12 is a view showing the method of manufacturing the semiconductor device of the first preferred embodiment in accordance with the present invention.

Next, in the process step of FIG. 12, the electron supply insulating film 11 formed o $SiO_b$ is deposited by using, for example, the plasma CVD method on the cap insulating film 10a, a portion of the high-concentration n-type impurity region 6 which is not covered with the cap insulating film 10a, and the barrier layer 4a of AlGaN. After that, a heat treatment is performed by using, for example, the RTA method or the like in the nitrogen atmosphere at 700 to 900° C., to thereby increase the positive electric charges generated in the interface of the region where the barrier layer 4a is in contact with the electron supply insulating film 11.

Figure 13:
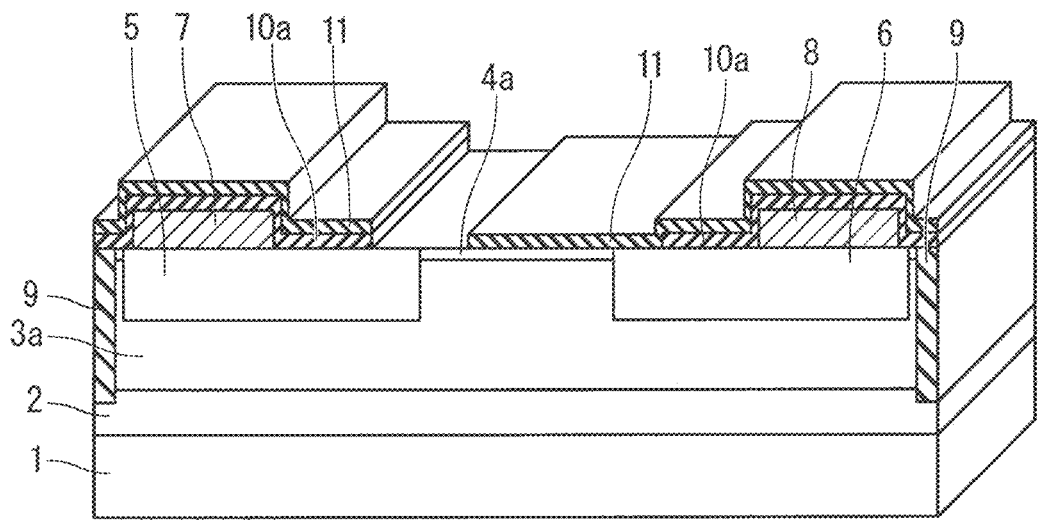
FIG. 13 is a view showing the method of manufacturing the semiconductor device of the first preferred embodiment in accordance with the present invention.

Next, in the process step of FIG. 13, the cap insulating film 10a and the electron supply insulating film 11 in a desired region are removed by the wet etching method using buffered hydrofluoric acid or the like with a resist pattern or the like as a mask. The region to be removed is a region ranging from a partial portion on the barrier layer 4a on the side of the high-concentration n-type impurity region 5 to a portion on the edge portion of the high-concentration n-type impurity region 5 adjacent to the barrier layer 4a.

Figure 14:
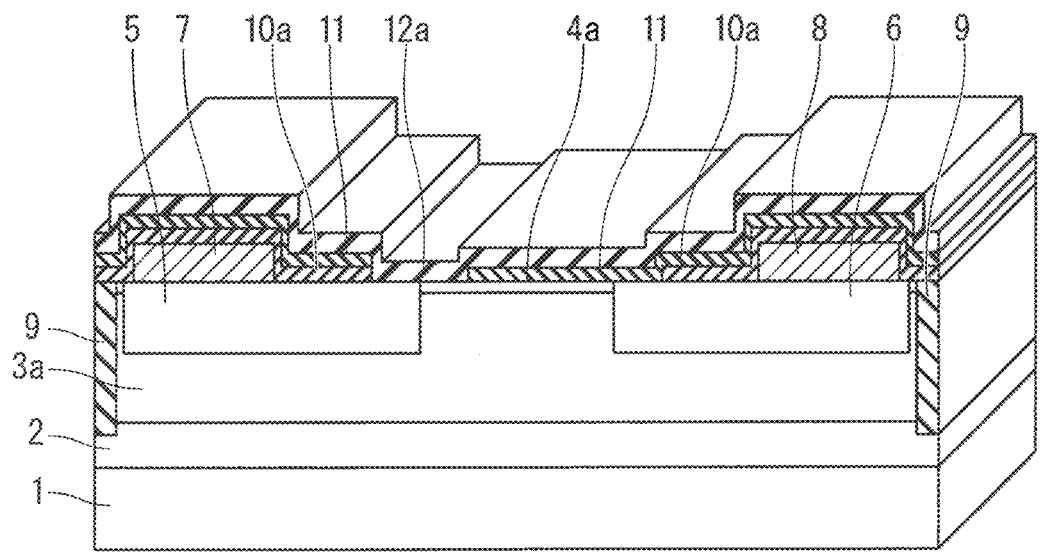
FIG. 14 is a view showing the method of manufacturing the semiconductor device of the first preferred embodiment in accordance with the present invention.

Next, in the process step of FIG. 14, the gate insulating film 12a formed of $AlO_c$ is deposited by using, for example, the atomic layer deposition method on the electron supply insulating film 11, a portion of the high-concentration n-type impurity region 5 which is not covered with the electron supply insulating film 11, and the barrier layer 4a of AlGaN.

Next, in the process step of FIG. 15, formed is a resist mask RM in which a portion on the gate insulating film 12a where the gate electrode 13 is to be formed is an opening OP. After that, a metal film formed of Ni (nickel) is formed on the resist mask RM and in the opening OP by vapor deposition, and then the resist mask RM is removed by using the lift-off method and the gate electrode 13 is thereby formed, to thus obtain the heterojunction field effect transistor 100 shown in FIG. 1.

The above-described process of manufacturing the heterojunction field effect transistor 100 has a characteristic feature that deposition and removal of the cap insulating film 10a shown in FIGS. 10 and 11, respectively, deposition of the electron supply insulating film 11 and the heat treatment at 700 to 900° C. shown in FIG. 12, removal of the cap insulating film 10a and the electron supply insulating film 11 shown in FIG. 13, deposition of the gate insulating film 12a shown in FIG. 14, and formation of the gate electrode 13 shown in FIG. 14 are performed in this order.

This process not only allows manufacture of the heterojunction field effect transistor 100 having the structure shown in FIG. 1 but also produces the following effects.

First, the heat treatment at 700 to 900° C. can be performed in a state where the barrier layer 4a in the channel region A is covered with the cap insulating film 10a and the barrier layer 4a in the drift region B is covered with the electron supply insulating film 11.

In the case where the heat treatment is performed at a high temperature of 700° C. or higher, if the barrier layer 4a is exposed in a space where the heat treatment is performed, nitrogen is separated from the barrier layer 4a and nitrogen vacancy serving as a factor causing an electronic trap is formed in the barrier layer 4a. Especially, when many nitrogen vacancies are present in the channel region A, there is apprehension that degradation of characteristics such as an increase in the leakage current and occurrence of the current collapse may be caused. Though desorption of nitrogen from the AlGaN layer which is caused by such a heat treatment can be suppressed by deposition of some insulating film on a surface of the AlGaN layer, the desorption cannot be completely suppressed and the effect is changed depending on an insulating film material to be used. An insulating film formed of $SiN_a$ is a material which is often used as a cap insulating film also in an activation heat treatment after the ion implantation, and is an insulating film material which can produce an effect of suppressing the desorption of nitrogen from the AlGaN layer, which is higher than that of other insulating film materials such as $SiO_b$, $AlO_c$, and the like. For this reason, by the present manufacturing method, it becomes possible to suppress the degradation of characteristics which is caused by the nitrogen vacancy.

Further, since the gate insulating film 12a of $AlO_c$ is formed after the heat treatment at 700 to 900° C., it is possible to prevent the heat treatment at a high temperature from being performed thereon. It is known that when the heat treatment at a high temperature of 700° C. or higher is performed on the gate insulating film formed of $AlO_c$, crystallization partially proceeds and the grain boundary serves as a leak path of current. Also in the heterojunction field effect transistor 100, when the heat treatment at a high temperature of 700° C. or higher is performed on the gate insulating film 12a, there is apprehension that the gate leakage current may increase. By the present manufacturing method, however, it is possible to prevent the heat treatment at a high temperature from being performed thereon, and therefore a low leakage current can be achieved.

Furthermore, in the region below the gate electrode 13 on the side of the drain electrode 8, the structure in which the gate electrode 13 is formed above the barrier layer 4a with the electron supply insulating film and the gate insulating film 12a interposed therebetween in this order can be formed. It thereby becomes possible to relieve the electric field concentration at the end portion of the gate electrode 13 on the side of the drain electrode 8 at the time when a high voltage is applied to the drain electrode 8 and further possible to apply a higher voltage thereto. Further, it becomes possible to suppress occurrence of current collapse due to the electric field concentration.

Further, in the region below the gate electrode 13 on the side of the source electrode 7, the structure in which the gate electrode 13 is formed above the high-concentration n-type impurity region 5 with the cap insulating film 10a, the electron supply insulating film 11, and the gate insulating film 12a interposed therebetween in this order can be formed. It thereby becomes possible to relieve the electric field concentration at the end portion of the gate electrode 13 on the side of the source electrode 7 at the time when a voltage is applied to the gate electrode 13, and further possible to suppress occurrence of the current collapse due to the electric field concentration.

Furthermore, though only the requisite minimum constituent elements needed to operate as the transistor are disclosed in FIG. 1 and the like, a device is finally completed through formation of a protection film, a field plate electrode, a wiring, an air bridge, a via hole, and the like.

Further, the formation of the high-concentration n-type impurity regions 5 and 6 shown in FIG. 7 does not necessarily need to be performed by the ion implantation method, but may be performed by etching and the MOCVD method, or the epitaxial growth method such as the MBE method or the like.

Furthermore, the formation of the isolation region 9 shown in FIG. 9 does not necessarily need to be performed by the ion implantation method, but there may be another method where a region reaching from the outermost surface of the barrier layer 4a into the buffer layer 2 is removed by etching, to cause the region in which the transistor is to be manufactured to have a mesa type structure, and the removed region serves as the isolation region 9.

Further, the above-described manufacturing process steps do not necessarily need to be executed in the order of description, but the order of execution may be changed. For example, the formation of the isolation region 9 shown in FIG. 9 may be performed after the formation of the high-concentration n-type impurity regions 5 and 6 shown in FIG. 7.

The Second Preferred Embodiment

FIG. 16 is a perspective view showing a cross-section structure of a heterojunction field effect transistor 200 formed of a nitride semiconductor of the second preferred embodiment in accordance with the present invention. Further, in FIG. 16, constituent elements identical to those in the heterojunction field effect transistor 100 described with reference to FIG. 1 are represented by the same reference signs, and redundant description will be omitted.

Though the heterojunction field effect transistor 100 shown in FIG. 1 has the structure in which in the region below the gate electrode 13 on the side of the source electrode 7, the gate electrode 13 is formed above the high-concentration n-type impurity region 5 with the cap insulating film 10a of $SiN_a$, the electron supply insulating film 11 of $SiO_b$, and the gate insulating film 12a of $AlO_c$ interposed therebetween in this order, the heterojunction field effect transistor 200 shown in FIG. 16 has a structure in which the gate electrode 13 is formed above the high-concentration n-type impurity region 5 with the electron supply insulating film and the gate insulating film 12a interposed therebetween in this order.

Also in such a structure, it becomes possible to relieve the electric field concentration at the end portion of the gate electrode 13 on the side of the source electrode 7 at the time when a voltage is applied to the drain electrode 8, and further possible to suppress occurrence of the current collapse due to the electric field concentration.

Further, such a structure can be manufactured by removing the cap insulating film 10a in a partial region ranging from the source electrode 7 to the region in which the gate electrode 13 is to be formed, in the removal of the cap insulating film 10a by using the resist pattern, which is described with reference to FIG. 11.

The Third Preferred Embodiment

Figure 17:
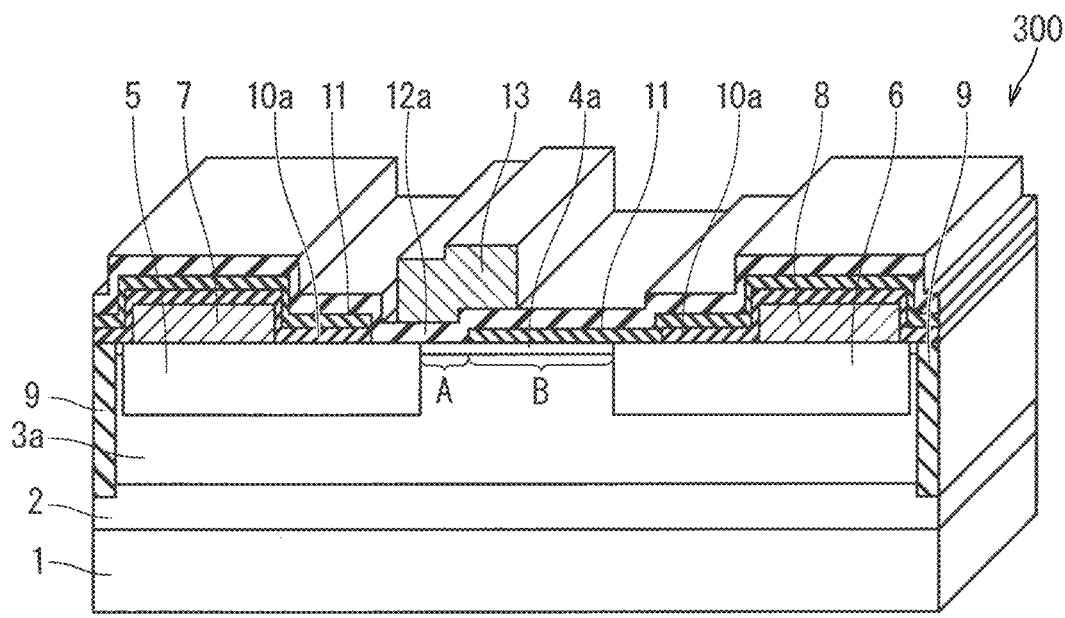
FIG. 17 is a perspective view showing a cross-section structure of a semiconductor device of a third preferred embodiment in accordance with the present invention.

FIG. 17 is a perspective view showing a cross-section structure of a heterojunction field effect transistor 300 formed of a nitride semiconductor of the third preferred embodiment in accordance with the present invention. Further, in FIG. 17, constituent elements identical to those in the heterojunction field effect transistor 100 described with reference to FIG. 1 are represented by the same reference signs, and redundant description will be omitted.

Though the heterojunction field effect transistor 100 shown in FIG. 1 has the structure in which in the region below the gate electrode 13 on the side of the source electrode 7, the gate electrode 13 is formed above the high-concentration n-type impurity region 5 with the cap insulating film 10a of $SiN_a$, the electron supply insulating film 11 of $SiO_b$, and the gate insulating film 12a of $AlO_c$ interposed therebetween in this order, the heterojunction field effect transistor 300 shown in FIG. 17 has a structure in which the gate electrode 13 is so formed as to extend from a portion above the edge portion of the high-concentration n-type impurity region 5 on the side of the barrier layer 4a of AlGaN to a portion above a center portion of the barrier layer 4a and the width thereof is smaller. For this reason, the edge portion of the gate electrode 13 on the side of the source electrode 7 is positioned above the high-concentration n-type impurity region 5 with the gate insulating film 12a interposed therebetween. In other words, the region below the gate electrode 13 on the side of the source electrode 7, like on a portion of the barrier layer 4a which serves as the channel region A, has a structure in which the gate electrode 13 is formed on the gate insulating film 12a, which is not an electric field relaxation structure.

Therefore, as compared with the heterojunction field effect transistor 100 shown in FIG. 1 and the heterojunction field effect transistor 200 shown in FIG. 16, reduced is the effect of relieving the electric field concentration at the end portion of the gate electrode 13 on the side of the source electrode 7 at the time when a voltage is applied to the drain electrode 8. For this reason, the effect of relieving the occurrence of the current collapse due to the electric field concentration is also reduced. On the other hand, a region in which the gate electrode 13 overlaps the high-concentration n-type impurity region 5 can be reduced. In a case where the region in which the gate electrode 13 overlaps the high-concentration n-type impurity region 5 is larger, the gate capacitance correspondingly increases and high-speed switching becomes difficult, but in the heterojunction field effect transistor 300, the gate capacitance can be reduced.

Further, also in the heterojunction field effect transistor 300, an edge portion of the gate electrode 13 on the side of the drain electrode 8 is positioned on a laminated layer film consisting of the electron supply insulating film 11 and the gate insulating film 12 and therefore has an electric field relaxation structure. In a case where this can sufficiently suppress the high voltage operation and the occurrence of the current collapse, the heterojunction field effect transistor 300 has an advantage in producing the effect of reducing the gate capacitance.

In accordance with an operating condition of a desired transistor, any one of the heterojunction field effect transistors 100 to 300 may be adopted.

Further, in order to manufacture the heterojunction field effect transistor 300, in the formation of the gate electrode 13 described with reference to FIG. 15, the width of the opening OP of the resist mask RM has only to be reduced so that the gate electrode 13 may be so formed as to extend from the portion above the edge portion of the high-concentration n-type impurity region 5 on the side of the barrier layer 4a of AlGaN to the portion above the center portion of the barrier layer 4a.

The Fourth Preferred Embodiment

Figure 18:
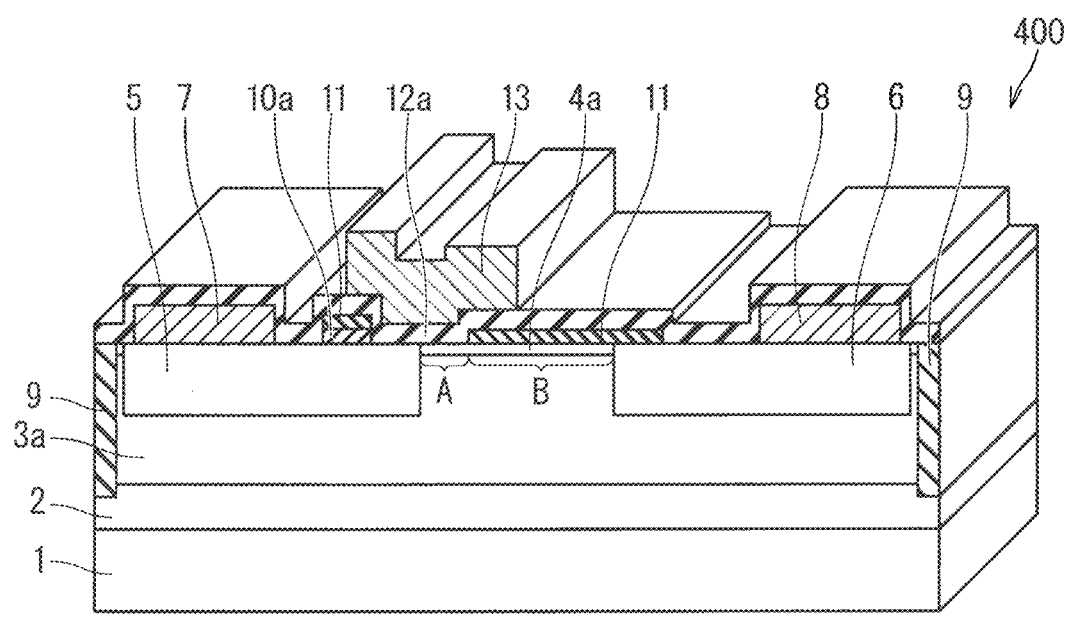
FIG. 18 is a perspective view showing a cross-section structure of a semiconductor device of a fourth preferred embodiment in accordance with the present invention.

FIG. 18 is a perspective view showing a cross-section structure of a heterojunction field effect transistor 400 formed of a nitride semiconductor of the fourth preferred embodiment in accordance with the present invention. Further, in FIG. 18, constituent elements identical to those in the heterojunction field effect transistor 100 described with reference to FIG. 1 are represented by the same reference signs, and redundant description will be omitted.

Though the heterojunction field effect transistor 100 of FIG. 1 has the structure in which the source electrode 7 and the drain electrode 8 are covered with a laminated layer film consisting of the cap insulating film 10a of $SiN_a$, the electron supply insulating film 11 of $SiO_b$, and the gate insulating film 12a of $AlO_c$, the heterojunction field effect transistor 400 has a structure in which the source electrode 7 and the drain electrode 8 are covered with only the gate insulating film 12a.

The edge portion of the gate electrode 13 on the side of the source electrode 7, however, is positioned above the high-concentration n-type impurity region 5 with the cap insulating film 10a, the electron supply insulating film 11, and the gate insulating film 12a interposed therebetween. In other words, the cap insulating film 10a and the electron supply insulating film 11 are laminated in this order only on a portion of the high-concentration n-type impurity region 5 below the edge portion of the gate electrode 13 on the side of the source electrode 7 and the laminated layer film is covered with the gate insulating film 12a.

Further, the edge portion of the gate electrode 13 on the side of the drain electrode 8 is positioned above the barrier layer 4a with the electron supply insulating film 11 and the gate insulating film 12a interposed therebetween.

Also in the heterojunction field effect transistor 400 having such a structure, like in the heterojunction field effect transistors 100 and 200, both the normally-off operation and the high breakdown voltage operation can be achieved.

In order to manufacture the heterojunction field effect transistor 400, in the removal of the cap insulating film 10a by using the resist pattern, which is described with reference to FIG. 11, the cap insulating film 10a is so removed as to remain only on the high-concentration n-type impurity region 5 below the edge portion of the gate electrode 13 on the side of the source electrode 7. Then, in the removal of the electron supply insulating film 11 by using the resist pattern, which is described with reference to FIG. 13, the electron supply insulating film 11 has only to be so removed as to remain only in a region ranging from a portion on the barrier layer 4a to another portion on the edge portion of the high-concentration n-type impurity region 6 and a region on the cap insulating film 10a on the high-concentration n-type impurity region 5.

The First Variation

Figure 19:
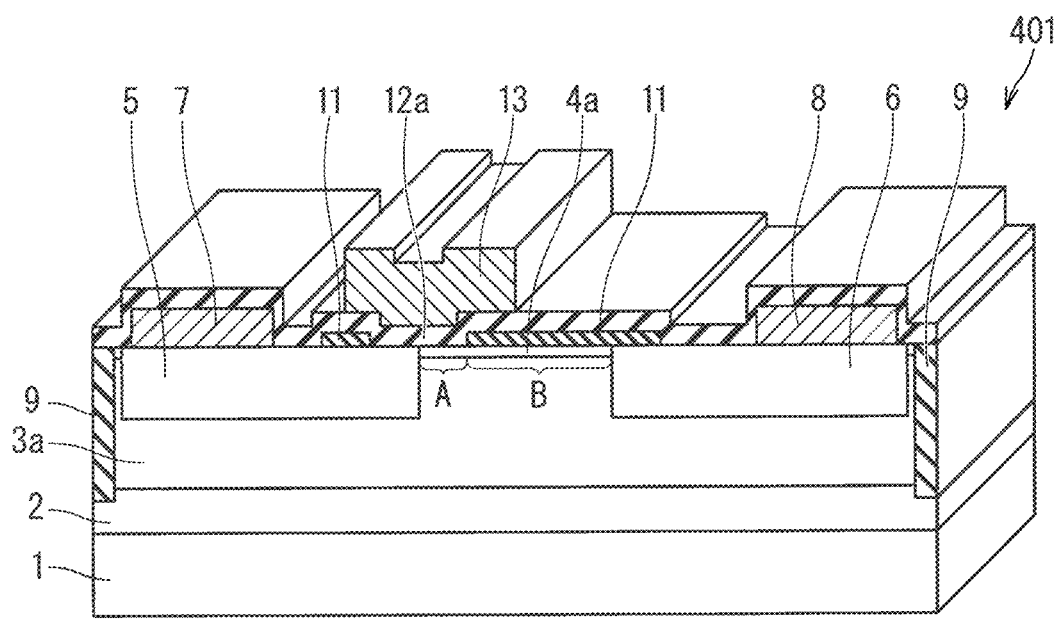
FIG. 19 is a perspective view showing a cross-section structure of a first variation of the semiconductor device of the fourth preferred embodiment in accordance with the present invention.

FIG. 19 is a perspective view showing a cross-section structure of a heterojunction field effect transistor 401 formed of a nitride semiconductor of the first variation of the fourth preferred embodiment in accordance with the present invention. Further, in FIG. 19, constituent elements identical to those in the heterojunction field effect transistor 400 described with reference to FIG. 18 are represented by the same reference signs, and redundant description will be omitted.

Though the edge portion of the gate electrode 13 on the side of the source electrode 7 is positioned above the high-concentration n-type impurity region 5 with the cap insulating film 10a, the electron supply insulating film 11, and the gate insulating film 12a interposed therebetween in the heterojunction field effect transistor 400 of FIG. 18, in the heterojunction field effect transistor 401, the edge portion of the gate electrode 13 on the side of the source electrode 7 is positioned above the high-concentration n-type impurity region 5 with the electron supply insulating film 11 and the gate insulating film 12a interposed therebetween. In other words, the electron supply insulating film 11 is formed on the high-concentration n-type impurity region 5 below the edge portion of the gate electrode 13 on the side of the source electrode 7, and the electron supply insulating film 11 is covered with the gate insulating film 12a.

Further, the structure in which the edge portion of the gate electrode 13 on the side of the drain electrode 8 is positioned above the barrier layer 4a with the electron supply insulating film 11 and the gate insulating film 12a interposed therebetween is the same as that of the heterojunction field effect transistor 400.

In order to manufacture the heterojunction field effect transistor 401, the process of manufacturing the cap insulating film 10a described with reference to FIG. 11 is not needed, and in the removal of the electron supply insulating film 11 by using the resist pattern, which is described with reference to FIG. 13, the electron supply insulating film 11 has only to be so removed as to remain only in the region ranging from the portion on the barrier layer 4a to another portion on the edge portion of the high-concentration n-type impurity region 6 and a portion on the high-concentration n-type impurity region 5 below the edge portion of the gate electrode 13 on the side of the source electrode 7.

The Second Variation

Figure 20:
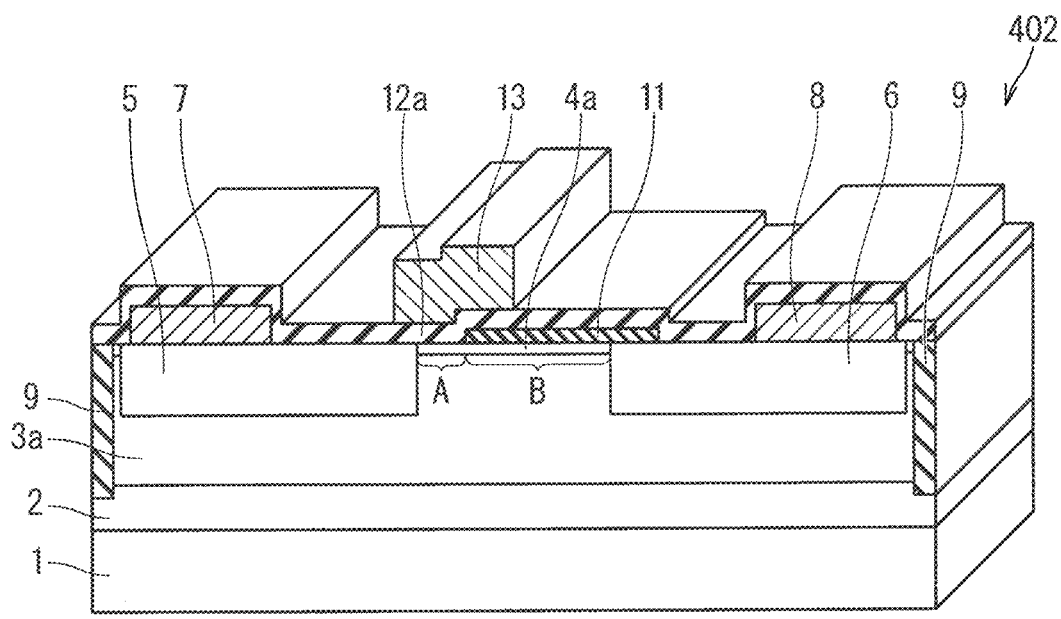
FIG. 20 is a perspective view showing a cross-section structure of a second variation of the semiconductor device of the fourth preferred embodiment in accordance with the present invention.

FIG. 20 is a perspective view showing a cross-section structure of a heterojunction field effect transistor 402 formed of a nitride semiconductor of the second variation of the fourth preferred embodiment in accordance with the present invention. Further, in FIG. 20, constituent elements identical to those in the heterojunction field effect transistor 400 described with reference to FIG. 18 are represented by the same reference signs, and redundant description will be omitted.

Though the edge portion of the gate electrode 13 on the side of the source electrode 7 is positioned above the high-concentration n-type impurity region 5 with the cap insulating film 10a, the electron supply insulating film 11, and the gate insulating film 12a interposed therebetween in the heterojunction field effect transistor 400 of FIG. 18, in the heterojunction field effect transistor 402, the edge portion of the gate electrode 13 on the side of the source electrode 7 is positioned above the high-concentration n-type impurity region 5 with the gate insulating film 12a interposed therebetween.

Further, the structure in which the edge portion of the gate electrode 13 on the side of the drain electrode 8 is positioned above the barrier layer 4a with the electron supply insulating film 11 and the gate insulating film 12a interposed therebetween is the same as that of the heterojunction field effect transistor 400.

Furthermore, the gate electrode 13 is so formed as to extend from the portion above the edge portion of the high-concentration n-type impurity region 5 on the side of the barrier layer 4a of AlGaN to the portion above the center portion of the barrier layer 4a and the width thereof is smaller. In other words, since the edge portion of the gate electrode 13 on the side of the source electrode 7 does not have the electric field relaxation structure, the width of the gate electrode 13 is made small in order to reduce the gate capacitance.

In order to manufacture the heterojunction field effect transistor 402, the process of manufacturing the cap insulating film 10a described with reference to FIG. 11 is not needed, and in the removal of the electron supply insulating film 11 by using the resist pattern, which is described with reference to FIG. 13, the electron supply insulating film 11 has only to be so removed as to remain only in the region ranging from the portion on the barrier layer 4a to another portion on the edge portion of the high-concentration n-type impurity region 6 and the portion on the high-concentration n-type impurity region 5 below the edge portion of the gate electrode 13 on the side of the source electrode 7.

Further, in the formation of the gate electrode 13 described with reference to FIG. 15, the width of the opening OP of the resist mask RM has only to be reduced so that the gate electrode 13 may be so formed as to extend from the portion above the edge portion of the high-concentration n-type impurity region 5 on the side of the barrier layer 4a of AlGaN to the portion above the center portion of the barrier layer 4a.

Furthermore, the respective structures of the above-described heterojunction field effect transistors 400, 401, and 402 are effective in a case where the materials forming the source electrode 7 and the drain electrode 8 are resistant to hydrofluoric acid used for removal of the cap insulating film 10a and the electron supply insulating film 11.

In a case where the materials forming the source electrode 7 and the drain electrode 8 are not resistant to hydrofluoric acid, any one of the structures of the heterojunction field effect transistors 100 to 300 of the first to third preferred embodiments has only to be adopted.

The Fifth Preferred Embodiment

<Device Configuration>

Figure 21:
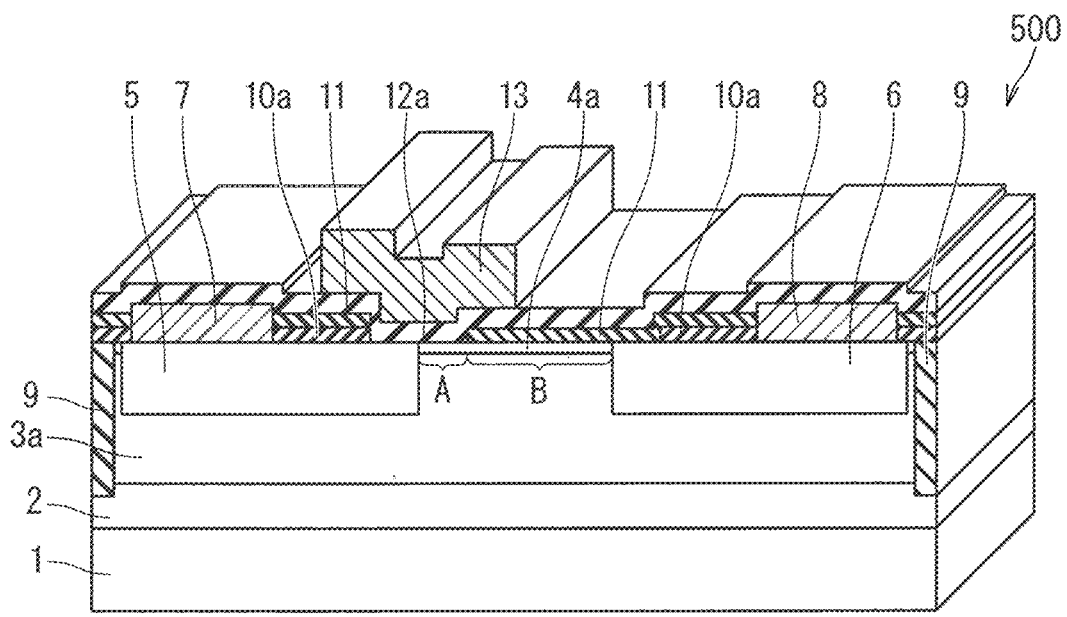
FIG. 21 is a perspective view showing a cross-section structure of a semiconductor device of a fifth preferred embodiment in accordance with the present invention.

FIG. 21 is a perspective view showing a cross-section structure of a heterojunction field effect transistor 500 formed of a nitride semiconductor of the fifth preferred embodiment in accordance with the present invention. Further, in FIG. 21, constituent elements identical to those in the heterojunction field effect transistor 100 described with reference to FIG. 1 are represented by the same reference signs, and redundant description will be omitted.

Though the heterojunction field effect transistor 100 of FIG. 1 has the structure in which the source electrode 7 and the drain electrode 8 are covered with the laminated layer film consisting of the cap insulating film 10a of $SiN_a$, the electron supply insulating film 11 of $SiO_b$, and the gate insulating film 12a of $AlO_c$, the heterojunction field effect transistor 500 has a structure in which respective upper surfaces of the source electrode 7 and the drain electrode 8 are covered with only the gate insulating film 12a, and the laminated layer film consisting of the cap insulating film 10a, the electron supply insulating film 11, and the gate insulating film 12a is in contact with respective side surfaces of the source electrode 7 and the drain electrode 8. The structure of the heterojunction field effect transistor 500 other than this structure is the same as that of the heterojunction field effect transistor 100, and both the normally-off operation and the high breakdown voltage operation can be achieved, like in the heterojunction field effect transistor 100.

<Manufacturing Method>

Next, an exemplary method of manufacturing the heterojunction field effect transistor 500 will be described with reference to FIGS. 6, 7, and 22 to 29 showing the manufacturing process steps in order. Further, in FIGS. 22 to 29, constituent elements identical to those in the heterojunction field effect transistor 100 shown in FIG. 1 are represented by the same reference signs, and redundant description will be omitted.

First, as described in the first preferred embodiment with reference to FIG. 6, on the substrate 1 of SiC, the buffer layer 2 of AlN, the channel layer 3a of GaN, and the barrier layer 4a of AlGaN are grown in this order by using the MOCVD method or the epitaxial growth method such as the MBE method or the like.

Next, as described in the first preferred embodiment with reference to FIG. 7, ions such as Si or the like, which are to become an n-type impurity in the nitride semiconductor, are doped into a desired region by the ion implantation method or the like using a resist pattern or the like as a mask under the conditions with an implantation dose amount of $1 \times 10^{13}$ to $1 \times 10^{16}$ $cm^{-2}$ and an implantation energy of 10 to 1000 keV. After that, a heat treatment is performed by using, for example, the RTA method or the like in the nitrogen atmosphere at 800 to 1500° C. and the doped ions are activated, to thereby form the high-concentration n-type impurity region 5 and the high-concentration n-type impurity region 6.

Figure 22:
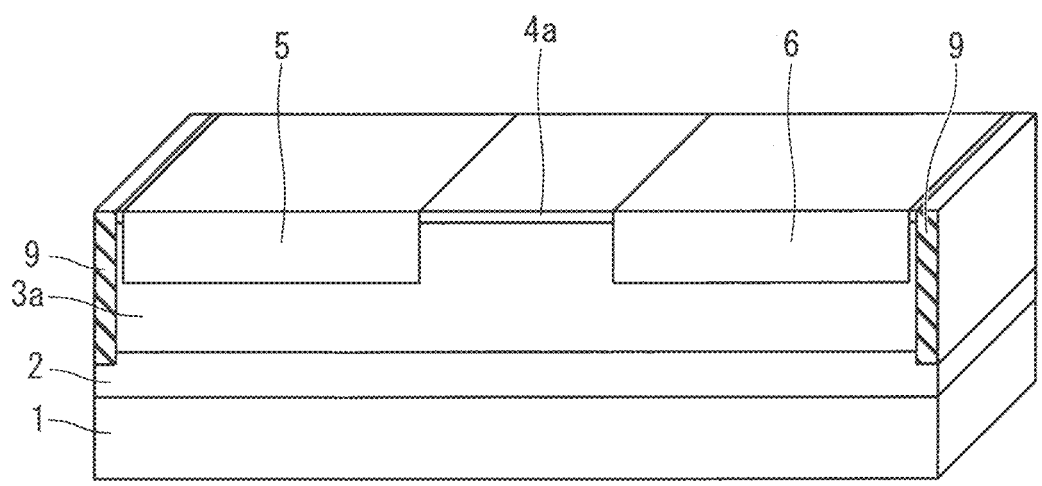
FIG. 22 is a view showing a method of manufacturing the semiconductor device of the fifth preferred embodiment in accordance with the present invention.

Next, in the process step of FIG. 22, Zn ions are implanted outside a region in which the transistor is to be manufactured, by using the ion implantation method, to thereby form the isolation region 9 reaching from the outermost surface of the barrier layer 4a into the buffer layer 2. Further, the technique for increasing the resistance of GaN by implanting Zn ions is well known, as described in the first preferred embodiment.

Figure 23:
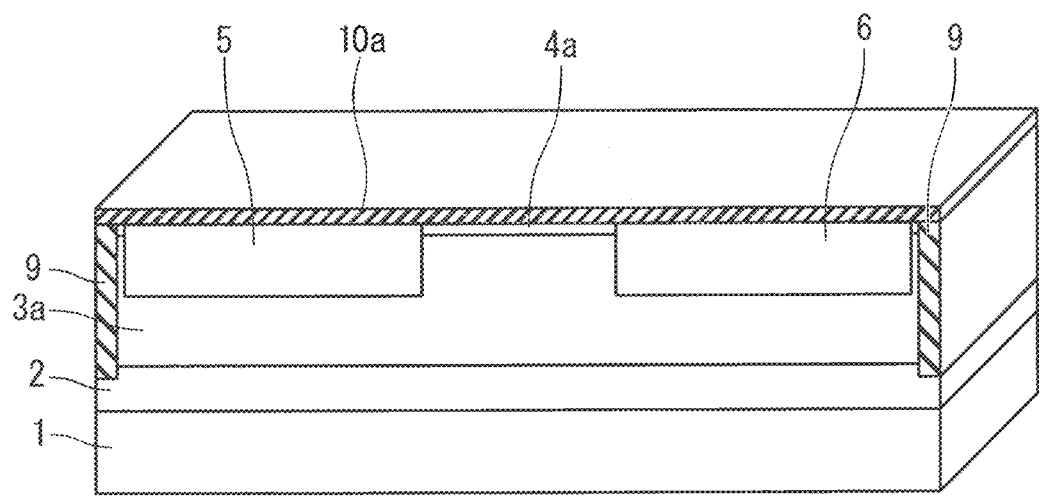
FIG. 23 is a view showing the method of manufacturing the semiconductor device of the fifth preferred embodiment in accordance with the present invention.

Next, in the process step of FIG. 23, on the channel layer 3a in which the isolation region 9 and the high-concentration n-type impurity regions 5 and 6 are formed, the cap insulating film 10a formed of SiN, is deposited by using, for example, the plasma CVD method.

Figure 24:
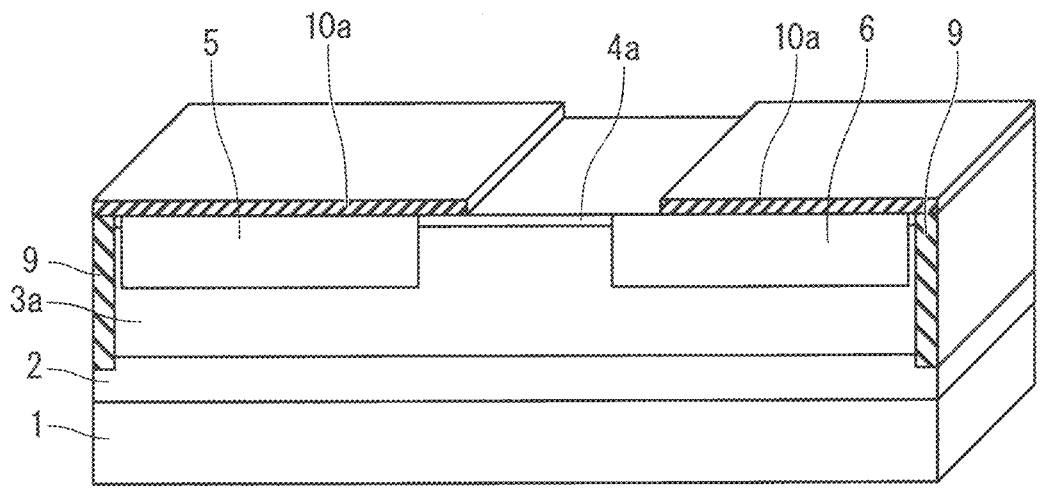
FIG. 24 is a view showing the method of manufacturing the semiconductor device of the fifth preferred embodiment in accordance with the present invention.

Next, in the process step of FIG. 24, the cap insulating film 10a in a desired region is removed by the wet etching method using buffered hydrofluoric acid or the like with a resist pattern or the like as a mask. The region to be removed is a region ranging from a partial portion on the barrier layer 4a to a portion on the edge portion of the high-concentration n-type impurity region 6 adjacent to the barrier layer 4a.

Figure 25:
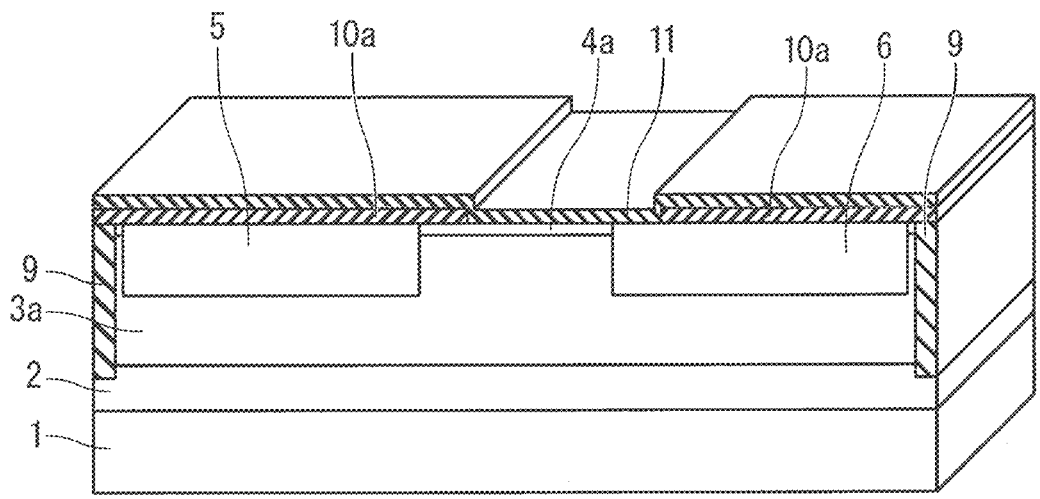
FIG. 25 is a view showing the method of manufacturing the semiconductor device of the fifth preferred embodiment in accordance with the present invention.

Next, in the process step of FIG. 25, the electron supply insulating film 11 formed of $SiO_b$ is deposited by using, for example, the plasma CVD method on the cap insulating film 10a, a portion of the high-concentration n-type impurity region 6 which is not covered with the cap insulating film 10a, and the barrier layer 4a of AlGaN.

Next, on the electron supply insulating film 11, a resist mask in which regions in which the source electrode 7 and the drain electrode 8 are to be formed are openings is formed, and with the resist mask used as an etching mask, the electron supply insulating film 11 and the cap insulating film 10a in the regions in which the source electrode 7 and the drain electrode 8 are to be formed are removed by the wet etching method using buffered hydrofluoric acid or the like.

After that, a multilayer film of metals is deposited on the etching mask and in the openings by vapor deposition, and the etching mask is removed by the lift-off method, to thereby leave the multilayer film of metals in the regions in which the source electrode 7 and the drain electrode 8 are to be formed. After that, in the process step of FIG. 27, a heat treatment is performed by using the RTA method or the like in the nitrogen atmosphere at a temperature of 700 to 900° C. and the deposited multilayer film is alloyed, to thereby form the source electrode 7 and the drain electrode 8, and the positive electric charge generated in the interface of a region where the barrier layer 4a and the electron supply insulating film 11 are in contact with each other is increased at the same time.

As the multilayer film of metals, for example, a multilayer film of Ti (titanium) and Al can be used, but in a case where the multilayer film is formed on the high-concentration n-type impurity region, any metals which are general-type metals to be each used as an electrode can obtain an ohmic contact, and therefore the metals to be used are not particularly restricted.

Figure 27:
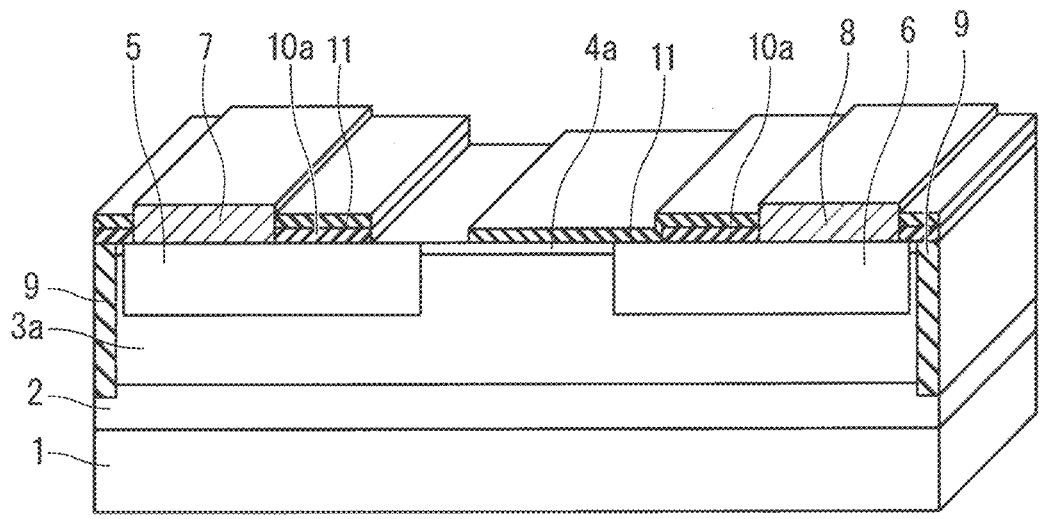
FIG. 27 is a view showing the method of manufacturing the semiconductor device of the fifth preferred embodiment in accordance with the present invention.

Next, in the process step of FIG. 27, the cap insulating film 10a and the electron supply insulating film 11 in a desired region are removed by the wet etching method using buffered hydrofluoric acid or the like with a resist pattern or the like as a mask. The region to be removed is a region ranging from a partial portion on the barrier layer 4a on the side of the high-concentration n-type impurity region 5 to a portion on the edge portion of the high-concentration n-type impurity region 5 adjacent to the barrier layer 4a.

Figure 28:
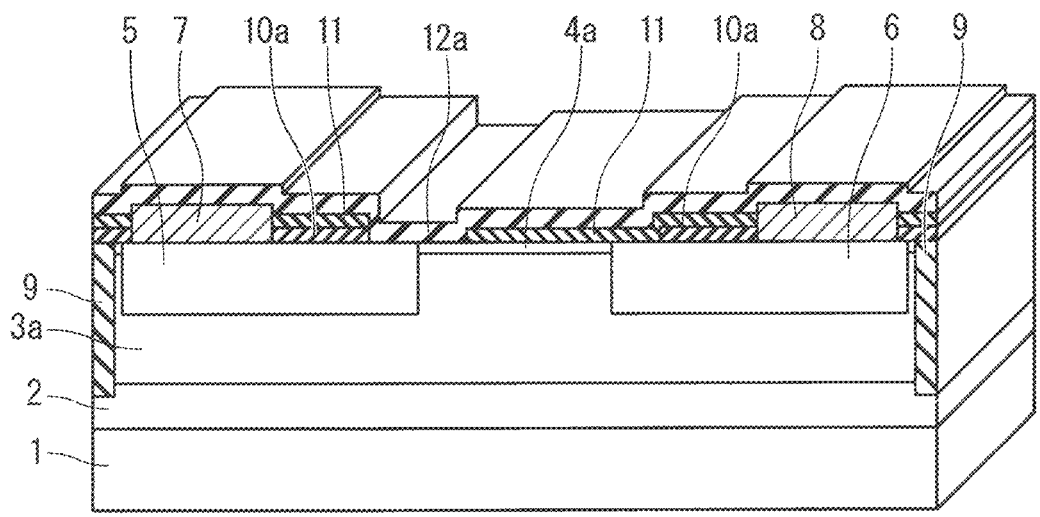
FIG. 28 is a view showing the method of manufacturing the semiconductor device of the fifth preferred embodiment in accordance with the present invention.

Next, in the process step of FIG. 28, the gate insulating film 12a formed of $AlO_c$ is deposited by using, for example, the atomic layer deposition method on the electron supply insulating film 11, respective upper surfaces of the source electrode 7 and the drain electrode 8 which are not covered with the electron supply insulating film 11, the high-concentration n-type impurity region 5, and the barrier layer 4a.

Figure 29:
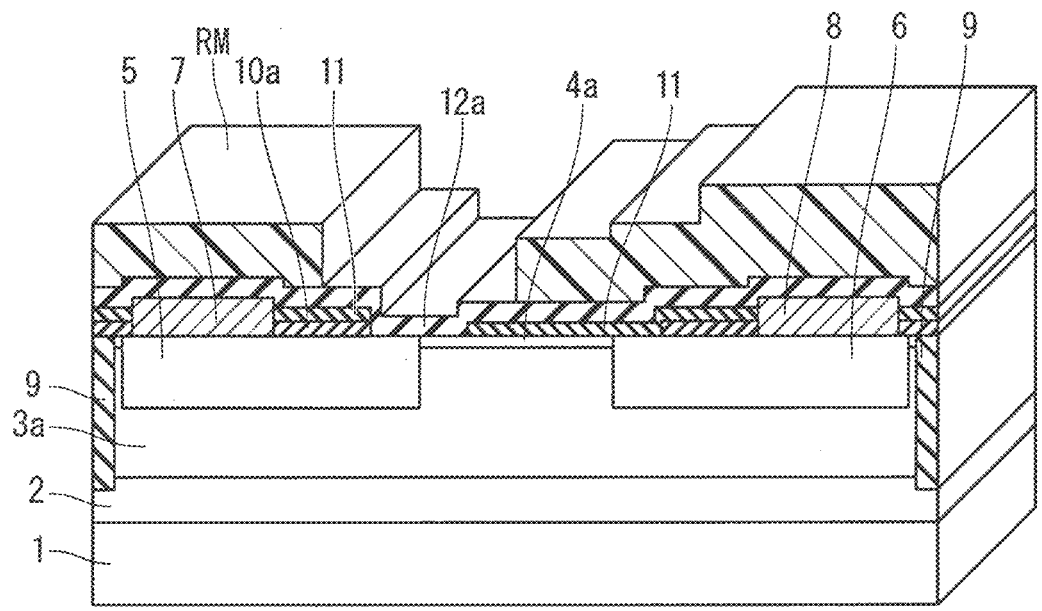
FIG. 29 is a view showing the method of manufacturing the semiconductor device of the fifth preferred embodiment in accordance with the present invention.

Next, in the process step of FIG. 29, a resist mask RM in which a portion where the gate electrode 13 is to be formed is an opening OP is formed on the gate insulating film 12a. After that, a metal film formed of Ni is formed on the resist mask RM and in the opening OP by vapor deposition, and then the resist mask RM is removed by using the lift-off method and the gate electrode 13 is thereby formed, to thus obtain the heterojunction field effect transistor 500 shown in FIG. 21.

Figure 26:
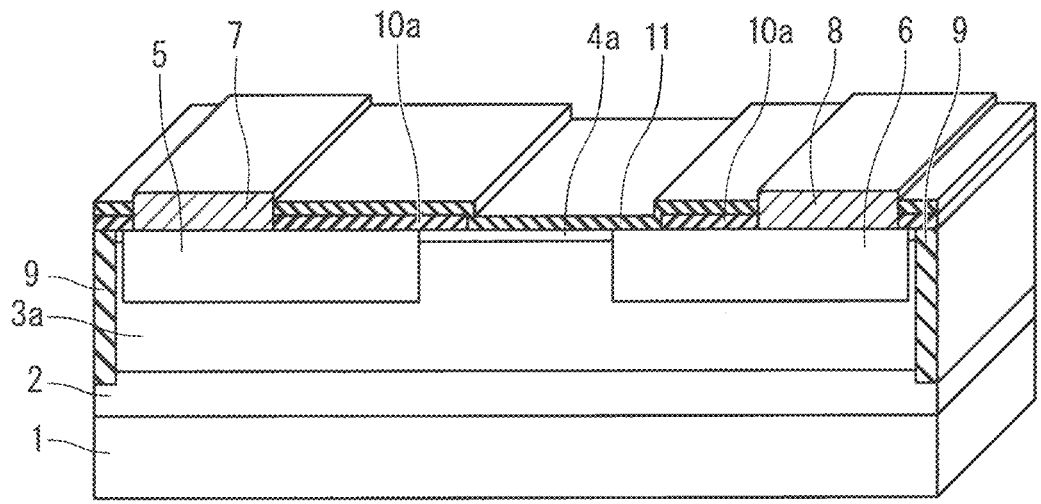
FIG. 26 is a view showing the method of manufacturing the semiconductor device of the fifth preferred embodiment in accordance with the present invention.

The above-described process of manufacturing the heterojunction field effect transistor 500, as shown in FIG. 26, is a manufacturing process where the formation of the source electrode 7 and the drain electrode 8 is performed after the deposition of the electron supply insulating film 11 shown in FIG. 25. This prevents the source electrode 7 and the drain electrode 8 from being exposed to hydrofluoric acid used for removing the cap insulating film 10a and the electron supply insulating film 11, and therefore this is a manufacturing process suitable for the case where the materials forming the source electrode 7 and the drain electrode 8 are not resistant to hydrofluoric acid.

The Sixth Preferred Embodiment

Figure 30:
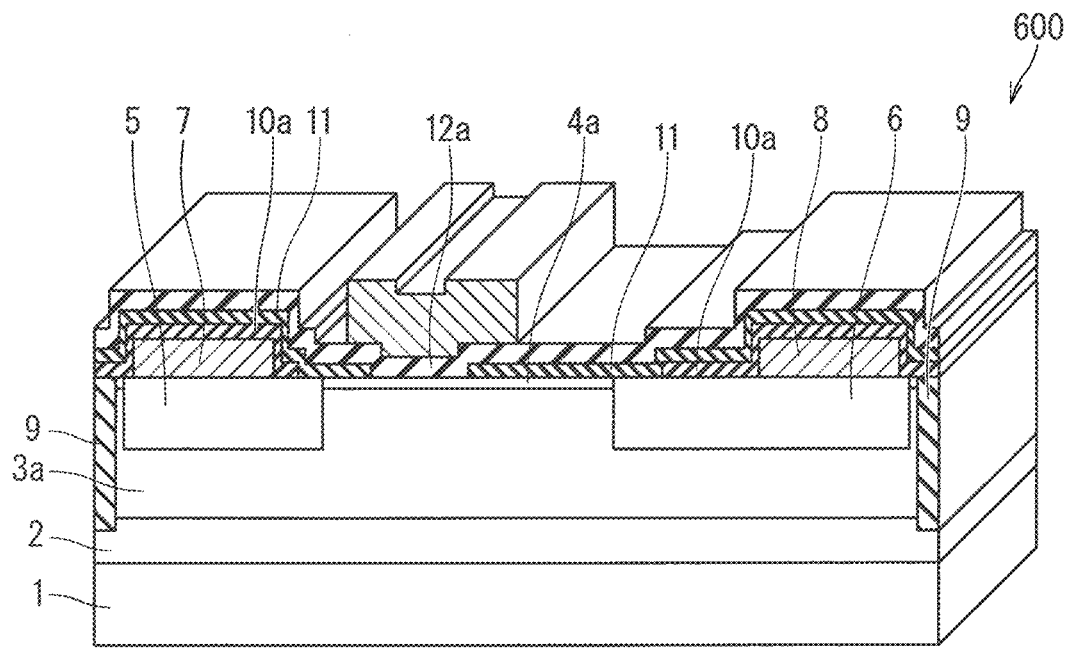
FIG. 30 is a perspective view showing a cross-section structure of a semiconductor device of a sixth preferred embodiment in accordance with the present invention.

FIG. 30 is a perspective view showing a cross-section structure of a heterojunction field effect transistor 600 formed of a nitride semiconductor of the sixth preferred embodiment in accordance with the present invention. Further, in FIG. 30, constituent elements identical to those in the heterojunction field effect transistor 200 described with reference to FIG. 16 are represented by the same reference signs, and redundant description will be omitted.

As compared with the heterojunction field effect transistor 100 shown in FIG. 1 and the heterojunction field effect transistor 200 shown in FIG. 16, the heterojunction field effect transistor 600 shown in FIG. 30 is different therefrom in the region in which the high-concentration n-type impurity region 5 is to be formed. Specifically, in the heterojunction field effect transistors 100 and 200, the high-concentration n-type impurity region 5 is formed ranging from the region below the source electrode 7 to the region below the gate electrode 13, and in the heterojunction field effect transistor 600, the high-concentration n-type impurity region 5 is formed so that the edge portion of the high-concentration n-type impurity region 5 on the side of the gate electrode 13 should not reach the region below the gate electrode. In other words, the high-concentration n-type impurity region 5 is not formed below the edge portion of the gate electrode 13 on the side of the source electrode 7.

Also in the heterojunction field effect transistor 600 having such a structure, like in the heterojunction field effect transistors 100 and 200, both the normally-off operation and the high breakdown voltage operation can be achieved.

On the other hand, since the high-concentration n-type impurity regions 5 and 6 are formed by the ion implantation method or the epitaxial growth method, the sheet resistance takes a value lower than that of the sheet resistance due to the 2DEG generated between the barrier layer 4a and the channel layer 3a and there is a possibility that the ON-resistance of the heterojunction field effect transistor 600 in which the high-concentration n-type impurity region 5 does not reach below the gate electrode 13 may be higher than those of the heterojunction field effect transistors 100 and 200.

If the amount of positive electric charges generated in the interface between the barrier layer 4a and the electron supply insulating film 11 is sufficiently large and the sheet resistance of this region is low enough not to produce any effect on the ON-resistance of the transistor, however, the heterojunction field effect transistor 600 can obtain the same operating characteristics as those of the heterojunction field effect transistors 100 and 200.

The Variation

Figure 31:
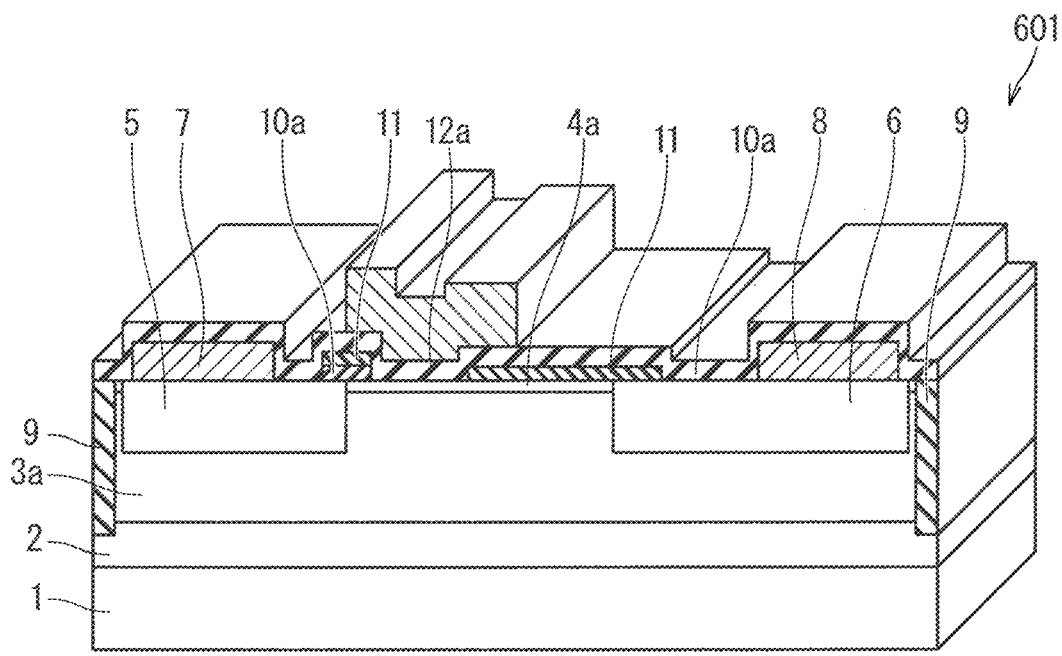
FIG. 31 is a perspective view showing a cross-section structure of a variation of the semiconductor device of the sixth preferred embodiment in accordance with the present invention.

FIG. 31 is a perspective view showing a cross-section structure of a heterojunction field effect transistor 601 formed of a nitride semiconductor of the variation of the sixth preferred embodiment in accordance with the present invention. Further, in FIG. 31, constituent elements identical to those in the heterojunction field effect transistor 600 described with reference to FIG. 30 are represented by the same reference signs, and redundant description will be omitted.

Though the heterojunction field effect transistor 600 of FIG. 30 has the structure in which the source electrode 7 and the drain electrode 8 are covered with the laminated layer film consisting of the cap insulating film 10a of $SiN_a$, the electron supply insulating film 11 of $SiO_b$, and the gate insulating film 12a of $AlO_c$, the heterojunction field effect transistor 601 has a structure in which the source electrode 7 and the drain electrode 8 are covered with only the gate insulating film 12a.

The edge portion of the gate electrode 13 on the side of the source electrode 7, however, is positioned above a boundary between the high-concentration n-type impurity region 5 and the barrier layer 4a with the cap insulating film 10a, the electron supply insulating film 11, and the gate insulating film 12a interposed therebetween. In other words, the cap insulating film 10a and the electron supply insulating film 11 are laminated in this order only below the edge portion of the gate electrode 13 on the side of the source electrode 7, and this laminated layer film is covered with the gate insulating film 12a.

Also in the heterojunction field effect transistor 601 having such a structure, like in the heterojunction field effect transistors 100 and 200, both the normally-off operation and the high breakdown voltage operation can be achieved.

Further, If the amount of positive electric charges generated in the interface between the barrier layer 4a and the electron supply insulating film 11 is sufficiently large and the sheet resistance of this region is low enough not to produce any effect on the ON-resistance of the transistor, the heterojunction field effect transistor 601 can obtain the same operating characteristics as those of the heterojunction field effect transistors 100 and 200.

The Seventh Preferred Embodiment

<Device Configuration>

Figure 32:
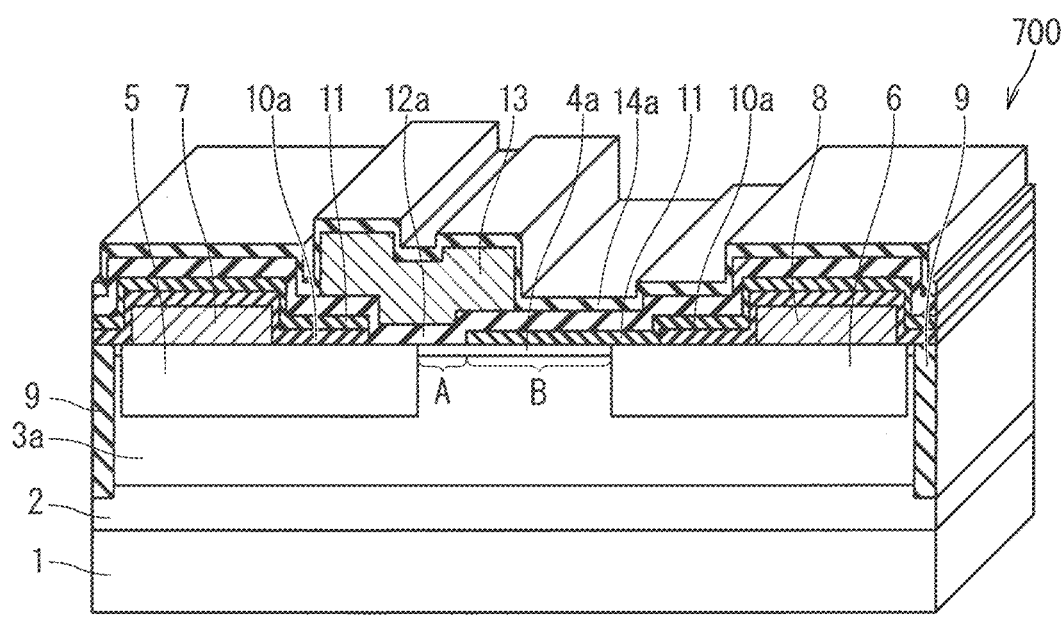
FIG. 32 is a perspective view showing a cross-section structure of a semiconductor device of a seventh preferred embodiment in accordance with the present invention.

FIG. 32 is a perspective view showing a cross-section structure of a heterojunction field effect transistor 700 formed of a nitride semiconductor of the seventh preferred embodiment in accordance with the present invention. Further, in FIG. 32, constituent elements identical to those in the heterojunction field effect transistor 100 described with reference to FIG. 1 are represented by the same reference signs, and redundant description will be omitted.

Though the heterojunction field effect transistor 100 shown in FIG. 1 has the structure in which the gate insulating film 12a is formed on the outermost surface except in the region where the gate electrode 13 is formed, the heterojunction field effect transistor 700 has a structure in which the gate electrode 13 and the gate insulating film 12a are covered with a coating insulating film 14a formed of $SiN_d$. It thereby becomes possible to prevent reduction in the drain current in the case where the heat treatment is performed after the gate electrode 13 is formed. This will be described below in detail.

In the heterojunction field effect transistor 700 of the seventh preferred embodiment, there is apprehension that reduction in the drain current is caused by formation of an interface state between the gate insulating film 12a and the barrier layer 4a below the gate electrode 13. As disclosed in WO 2018/037530, this interface state can be reduced by performing the heat treatment at 300 to 700° C. after forming the gate electrode 13. Further, as disclosed in WO 2018/220741, this interface state can be also reduced by performing the heat treatment at 250 to 300° C. while applying a voltage to the gate electrode 13 after forming the gate electrode 13.

In the heterojunction field effect transistors shown in FIGS. 1 and 16 to 21 of the first to sixth preferred embodiments in accordance with the present invention, however, when the heat treatment is performed in a state where the gate insulating film 12a is formed on the outermost surface in the drift region B after the gate electrode 13 is formed, the concentration of the 2DEG generated in the interface between the channel layer 3a and the barrier layer 4a in the drift region B decreases and the resistance of this region increases, and consequently the drain current is reduced.

Next, shown are results of verifying the above-described phenomenon in which by performing the heat treatment in the state where the gate insulating film 12a is formed on the outermost surface in the drift region B, the sheet resistance $Rs_{ch}$ due to the 2DEG generated in the interface between the channel layer 3a and the barrier layer 4a is increased, and the phenomenon in which by adopting a structure where the gate insulating film 12a is covered with the coating insulating film 14a formed of $SiN_d$, the increase in the sheet resistance $Rs_{ch}$ is suppressed.

Figure 33:
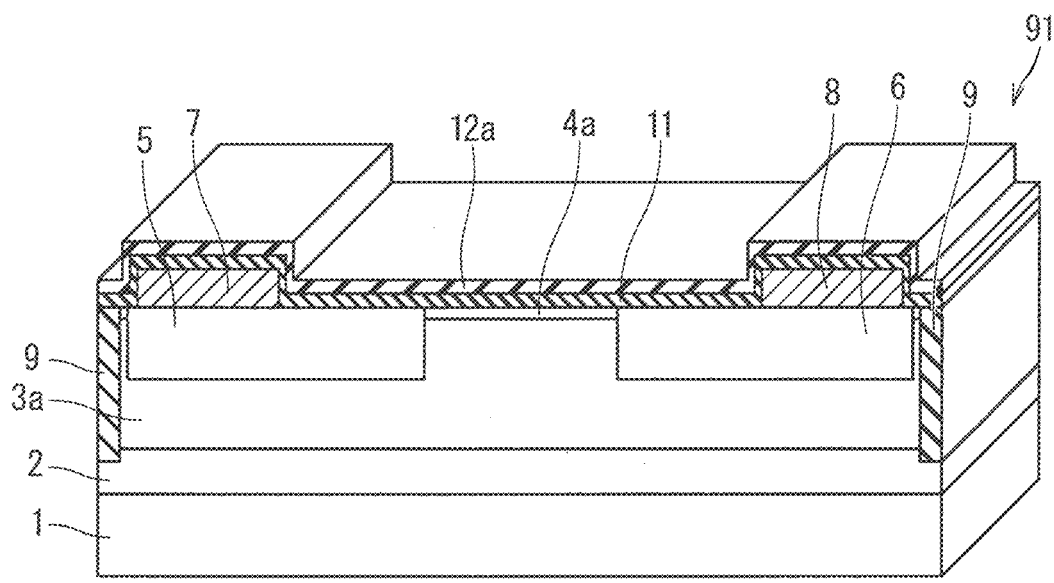
FIG. 33 is a perspective view showing a cross-section structure of the semiconductor device of the seventh preferred embodiment in accordance with the present invention.
Figure 34:
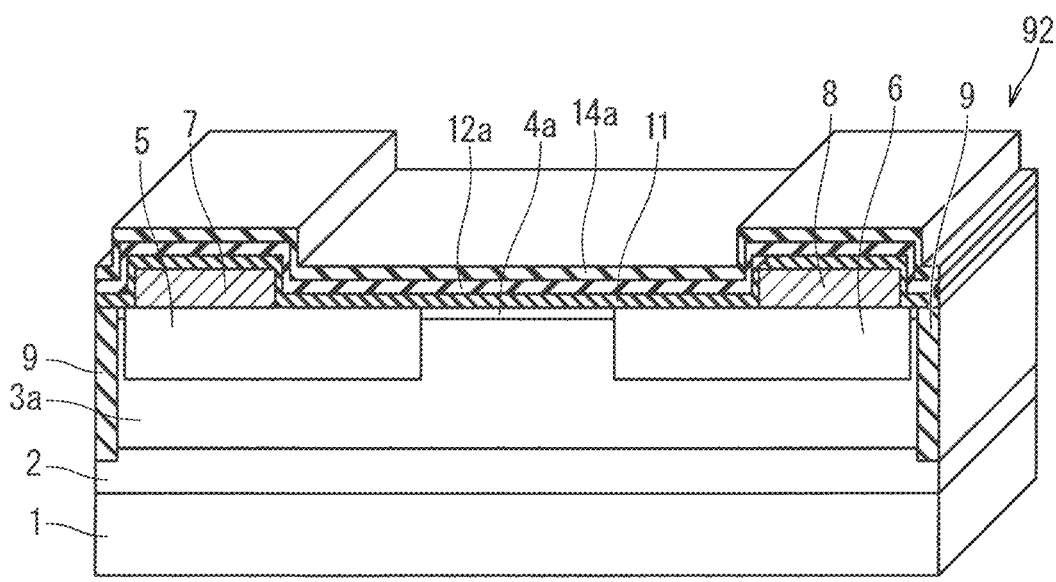
FIG. 34 is a perspective view showing a cross-section structure of the semiconductor device of the seventh preferred embodiment in accordance with the present invention.

FIGS. 33 and 34 are perspective views showing respective cross-section structures of a sample 91 and a sample 92 used for the verifications. In the sample 91 and the sample 92, constituent elements identical to those in the sample 90 shown in FIG. 2 are represented by the same reference signs, and redundant description will be omitted.

In the sample 91, the structure ranging from the substrate 1 to the electron supply insulating film 11 is the same as that of the sample 90, and the gate insulating film 12a is so formed as to cover a surface of the electron supply insulating film 11.

Such a structure can be manufactured by using a method in which the gate insulating film 12a formed of $AlO_c$ is deposited on the electron supply insulating film 11 in a surface of the sample 90 shown in FIG. 2 by using, for example, the atomic layer deposition method.

In the sample 92, the structure ranging from the substrate 1 to the gate insulating film 12a is the same as that of the sample 91, and the coating insulating film 14a of $SiN_d$ is so formed as to cover a surface of the gate insulating film 12a.

Such a structure can be manufactured by using a method in which the coating insulating film 14a formed of $SiN_d$ is deposited on the gate insulating film 12a in a surface of the sample 91 shown in FIG. 33 by using, for example, the plasma CVD method.

Figure 35:
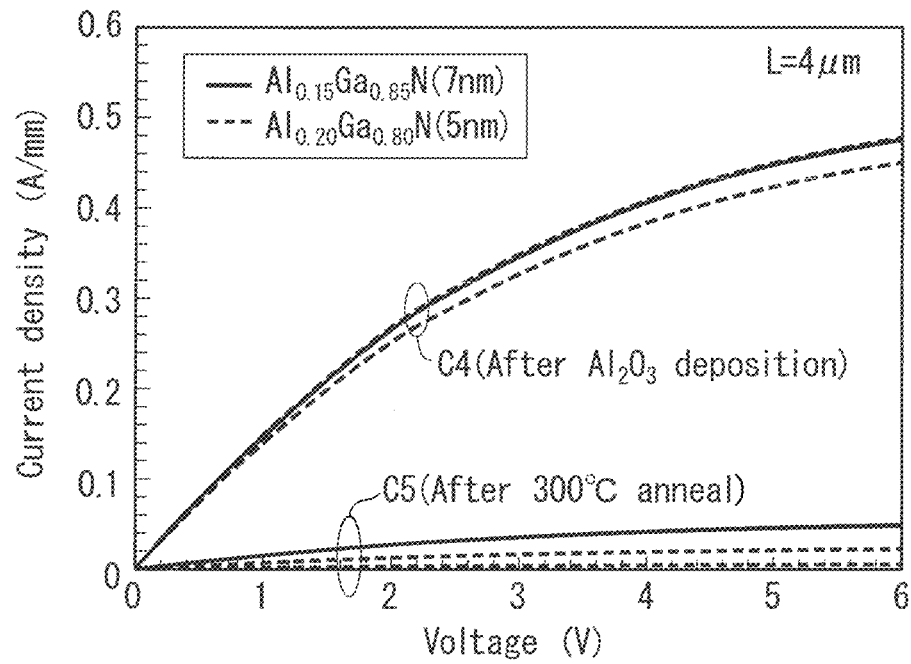
FIG. 35 is a graph showing current-voltage (I-V) characteristics measured between the source electrode and the drain electrode in the sample used for the verification.
Figure 36:
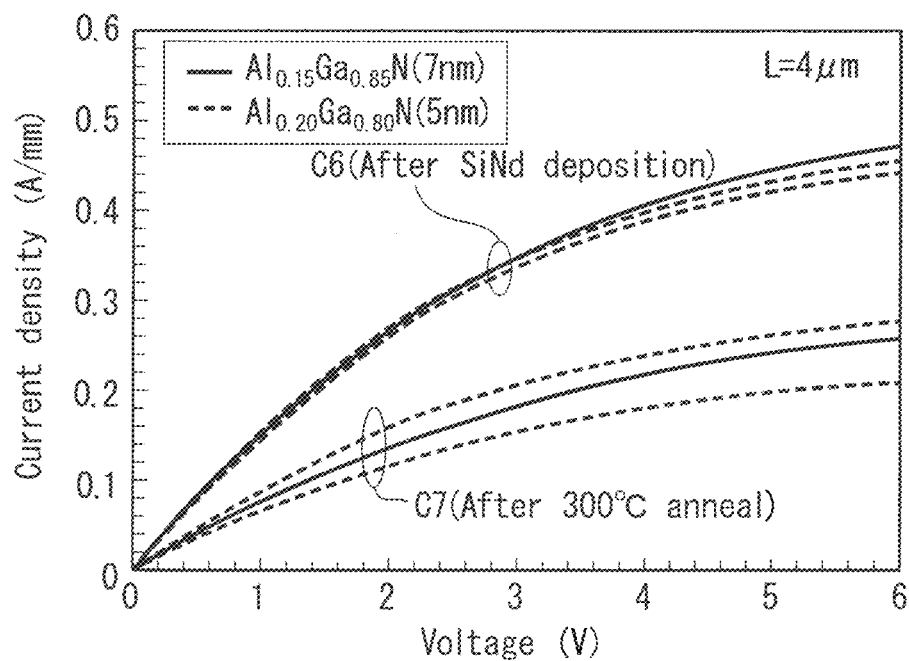
FIG. 36 is a graph showing current-voltage (I-V) characteristics measured between the source electrode and the drain electrode in the sample used for the verification.

FIGS. 35 and 36 are graphs showing respective current-voltage (I-V) characteristics measured between the source electrode 7 and the drain electrode 8 in the sample 91 shown in FIG. 33 and the sample 92 shown in FIG. 34, respectively, wherein the horizontal axis represents the voltage (V) and the vertical axis represents the current density (A/mm).

FIG. 35 shows a measurement result C4 (After $Al_2O_3$ deposition) immediately after depositing the gate insulating film 12a and a measurement result C5 (After 300° C. anneal) after performing a heat treatment at 300° C. for five minutes after depositing the gate insulating film 12a. Further, since two samples are produced on the same substrate and measurement is performed thereon, two characteristics are shown in any one measurement result.

FIG. 36 shows a measurement result C6 (After $SiN_d$ deposition) immediately after depositing the coating insulating film 14a and a measurement result C7 (After 300° C. anneal) after performing a heat treatment at 300° C. for five minutes after depositing the coating insulating film 14a. Further, since two samples are produced on the same substrate and measurement is performed thereon, two characteristics are shown in any one measurement result.

It is assumed that the width of each of the high-concentration n-type impurity regions 5 and 6 is 100 μm and the distance between the high-concentration n-type impurity regions 5 and 6 is 4 μm (L=4 μm). Further, FIGS. 35 and 36 show respective characteristics in the case where the Al composition and the thickness of the barrier layer 4a are 20% and 5 nm and the case where the Al composition and the thickness are 15% and 7 nm, respectively.

In the case where the coating insulating film 14a is not formed, as shown in FIG. 35, obtained is a result in which the current value is significantly reduced to less than or equal to 0.05 A/mm by the heat treatment at 300° C. On the other hand, in the case where the coating insulating film 14a is formed, as shown in FIG. 36, the current value is reduced but takes a value of greater than or equal to 0.2 A/mm by the heat treatment at 300° C.

From these results, in the case where the coating insulating film 14a ($SiN_d$) is formed on the gate insulating film 12a ($AlO_c$), it is experimentally verified that the phenomenon in which the sheet resistance due to the 2DEG generated in the interface between the channel layer 3a and the barrier layer 4a is increased by the heat treatment can be suppressed.

The phenomenon in which the sheet resistance due to the 2DEG generated in the interface between the channel layer 3a and the barrier layer 4a is increased by performing the heat treatment after the gate insulating film 12a is formed is caused by that the positive electric charge induced in the interface between $SiO_b$ and AlGaN is reduced by the heat treatment after the gate insulating film 12a is formed and the 2DEG generated in the interface between the channel layer 3a and the barrier layer 4a is accordingly reduced. Then, the coating insulating film 14a has an effect of suppressing the reduction in the positive electric charge induced in the interface between $SiO_b$ and AlGaN.

Further, the reason why the coating insulating film 14a is represented as $SiN_d$ is that this is a compound of Si (silicon) and N (nitrogen) but is a deposited film, and therefore the composition is not always represented as general-type "$Si_3N_4$".

Figure 37:
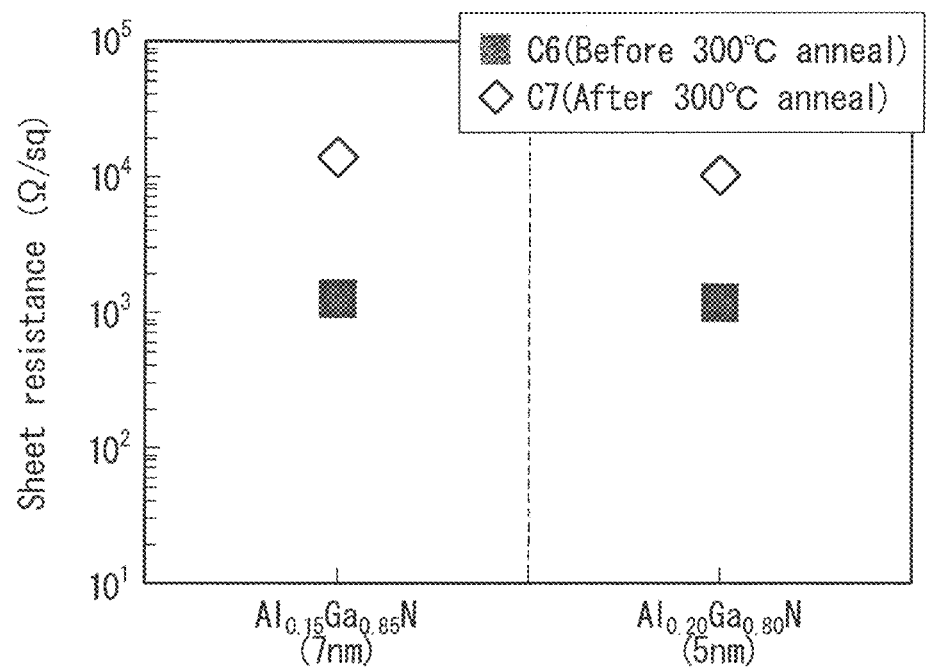
FIG. 37 is a sheet resistance diagram before and after a heat treatment on the semiconductor device of the seventh preferred embodiment in accordance with the present invention.
Figure 38:
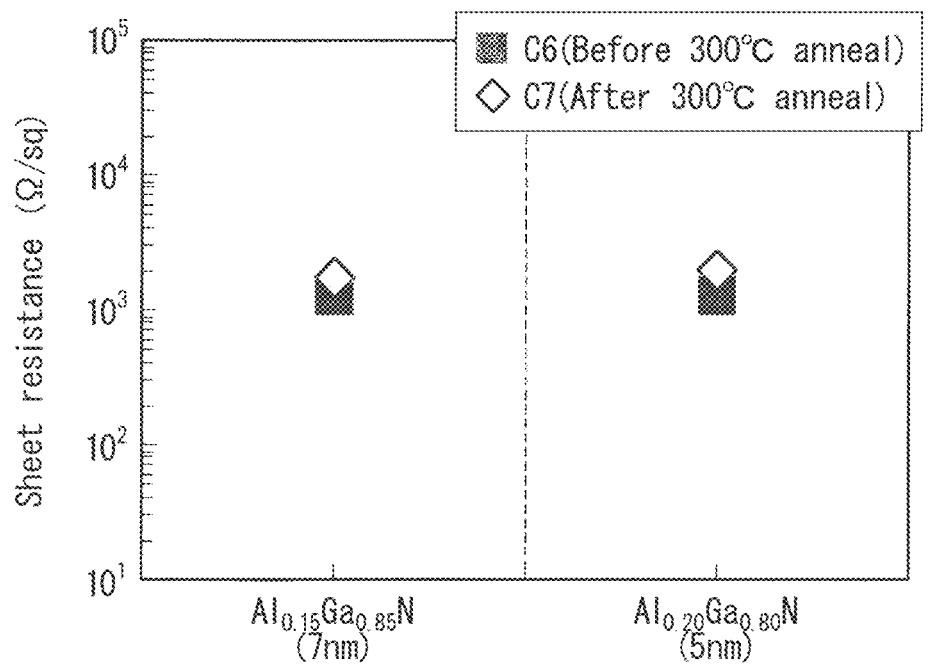
FIG. 38 is a sheet resistance diagram before and after the heat treatment on the semiconductor device of the seventh preferred embodiment in accordance with the present invention.

Furthermore, FIGS. 37 and 38 show the sheet resistances (Ω/sq) obtained from the I-V characteristics measured by using different patterns in a range of the distance between the high-concentration n-type impurity regions 5 and 6 from 2 to 20 μm.

In FIG. 37, the sheet resistances before and after the heat treatment at 300° C. in the sample 91 of FIG. 33 are represented by ■ and ◇, respectively, and in FIG. 38, the sheet resistances before and after the heat treatment at 300° C. in the sample 92 of FIG. 34 are represented by ■ and ◇, respectively.

It is verified from FIG. 37 that in the case where the coating insulating film 14a is not formed, the sheet resistance is increased by about one digit by the heat treatment at 300° C. Further, it is verified from FIG. 38 that in the case where the coating insulating film 14a is formed, the increase in the sheet resistance is significantly suppressed.

As described above, in the heterojunction field effect transistor 700 of the seventh preferred embodiment, both the normally-off operation and the high breakdown voltage operation can be achieved.

<Manufacturing Method>

Next, an exemplary method of manufacturing the heterojunction field effect transistor 700 will be described with reference to FIGS. 6 to 15, 1, and 32 showing the manufacturing process steps in order.

First, as described in the first preferred embodiment with reference to FIGS. 6 to 15, the heterojunction field effect transistor 100 shown in FIG. 1 is obtained.

Next, the coating insulating film 14a formed of $SiN_d$ is deposited on the gate electrode 13 and the gate insulating film 12a by using, for example, the plasma CVD method, to thereby obtain the heterojunction field effect transistor 700 shown in FIG. 32.

Next, a heat treatment is performed at 300° C. at least in order to reduce the interface state formed between the gate insulating film 12a and the barrier layer 4a.

Thus, by performing the heat treatment to reduce the interface state after the coating insulating film 14a is formed, it is possible to suppress reduction in the current due to this heat treatment.

The First Variation

Figure 39:
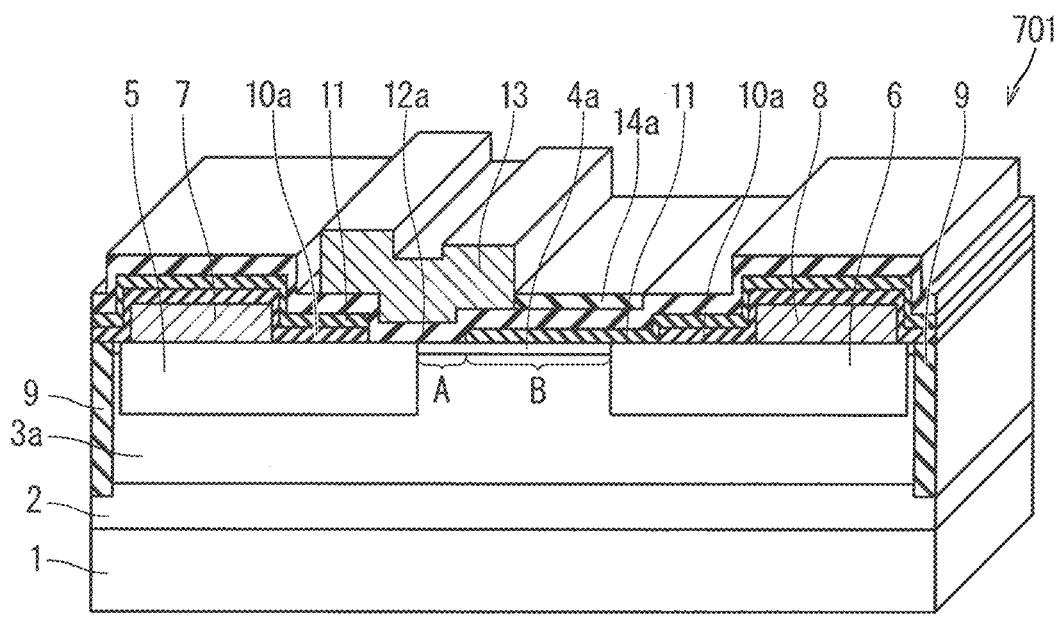
FIG. 39 is a perspective view showing a cross-section structure of a first variation of the semiconductor device of the seventh preferred embodiment in accordance with the present invention.

FIG. 39 is a perspective view showing a cross-section structure of a heterojunction field effect transistor 701 formed of a nitride semiconductor of the first variation of the seventh preferred embodiment in accordance with the present invention. Further, in FIG. 39, constituent elements identical to those in the heterojunction field effect transistor 700 described with reference to FIG. 32 are represented by the same reference signs, and redundant description will be omitted.

Though the coating insulating film 14a is so formed as to cover the entire region of the transistor 700 in the heterojunction field effect transistor 700 of FIG. 32, in the heterojunction field effect transistor 701 of FIG. 39, the coating insulating film 14a is so provided as to be buried between a side surface of the gate electrode 13 and that of a stepped portion of the gate insulating film 12a, being so formed as to cover above the drift region B. Further, such a structure can be obtained by selectively removing the coating insulating film 14a after the heterojunction field effect transistor 700 is formed.

Since the reduction in the drain current by the heat treatment after forming the gate insulating film 12a is caused by an increase in the resistance in the drift region B, if at least this region is covered with the coating insulating film 14a, it becomes possible to suppress the reduction in the drain current.

The Second Variation

Figure 40:
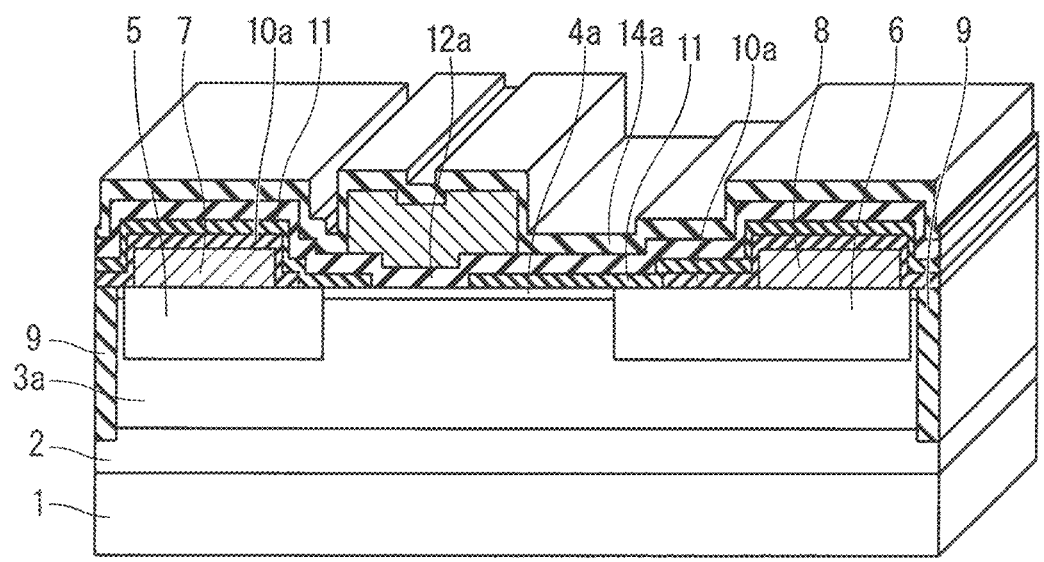
FIG. 40 is a perspective view showing a cross-section structure of a second variation of the semiconductor device of the seventh preferred embodiment in accordance with the present invention.

FIG. 40 is a perspective view showing a cross-section structure of a heterojunction field effect transistor 702 formed of a nitride semiconductor of the second variation of the seventh preferred embodiment in accordance with the present invention. Further, the present variation has a structure in which the coating insulating film 14a is provided in the heterojunction field effect transistor 600 of the sixth preferred embodiment, and in FIG. 40, constituent elements identical to those in the heterojunction field effect transistor 600 described with reference to FIG. 30 are represented by the same reference signs, and redundant description will be omitted.

As compared with the heterojunction field effect transistor 100 shown in FIG. 1 and the heterojunction field effect transistor 200 shown in FIG. 16, the heterojunction field effect transistor 600 shown in FIG. 30 is different therefrom in the region in which the high-concentration n-type impurity region 5 is to be formed. Specifically, in the heterojunction field effect transistors 100 and 200, the high-concentration n-type impurity region 5 is formed ranging from the region below the source electrode 7 to the region below the gate electrode 13, and in the heterojunction field effect transistor 600, the high-concentration n-type impurity region 5 is formed so that the edge portion of the high-concentration n-type impurity region 5 on the side of the gate electrode 13 should not reach the region below the gate electrode. In other words, the high-concentration n-type impurity region 5 is not formed below the edge portion of the gate electrode 13 on the side of the source electrode 7.

In the heterojunction field effect transistor 600 having such a structure, by performing the heat treatment after the gate insulating film 12a is formed, the resistance increases and the drain current decreases also in the region ranging from the high-concentration n-type impurity region 5 to a portion below the gate electrode 13. In order to suppress this phenomenon, as shown in FIG. 40, the coating insulating film 14a is so formed as to cover the entire region of the heterojunction field effect transistor 700 and a portion above the above-described region is covered with the coating insulating film 14a.

The Eighth Preferred Embodiment

Figure 41:
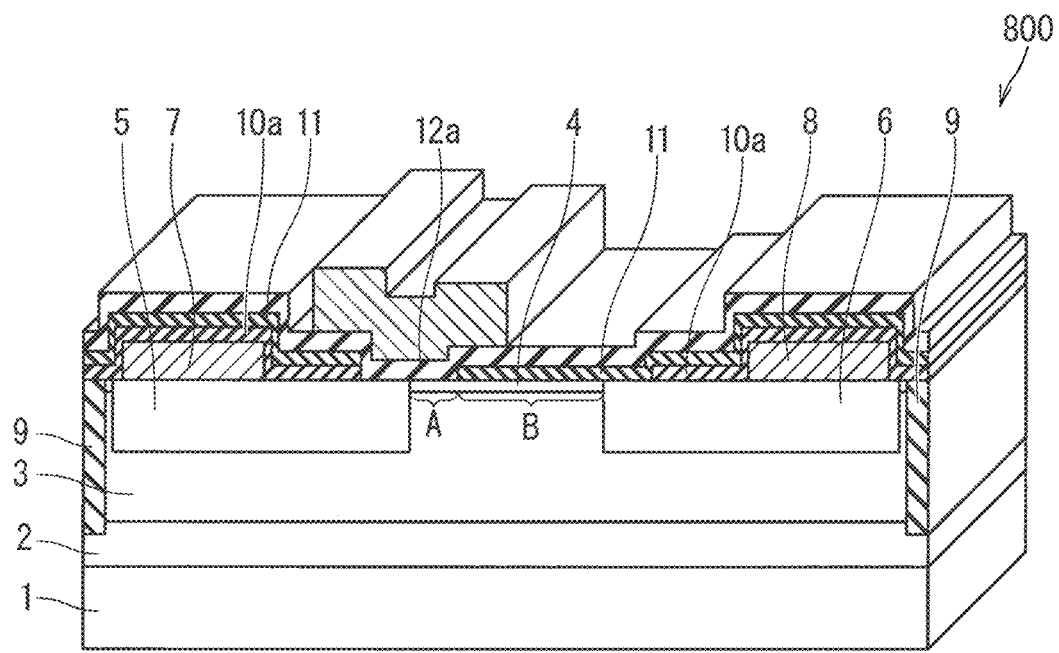
FIG. 41 is a perspective view showing a cross-section structure of a semiconductor device of an eighth preferred embodiment in accordance with the present invention.

FIG. 41 is a perspective view showing a cross-section structure of a heterojunction field effect transistor 800 formed of a nitride semiconductor of the eighth preferred embodiment in accordance with the present invention. Further, in FIG. 41, constituent elements identical to those in the heterojunction field effect transistor 100 described with reference to FIG. 1 are represented by the same reference signs, and redundant description will be omitted.

Though it is assumed that the channel layer 3a is formed of GaN and the barrier layer 4a is formed of AlGaN in the heterojunction field effect transistors of the first to seventh preferred embodiments described above, it is not always necessary to use GaN and AlGaN, and the same effects as those produced by the heterojunction field effect transistors of the first to seventh preferred embodiments can be produced even in a case where the channel layer and the barrier layer are formed of nitride semiconductors other than GaN or AlGaN.

In the heterojunction field effect transistor 800 of FIG. 41, the channel layer 3a formed of GaN and the barrier layer 4a formed of AlGaN are replaced by a channel layer 3 formed of $Al_{x1}In_{y1}Ga_{1-x1-y1}N$ (aluminum indium gallium nitride) and a barrier layer 4 formed of $Al_{x2}In_{y2}Ga_{1-x2-y2}N$, respectively. Further, it is assumed that $Al_{x2}In_{y2}Ga_{1-x2-y2}N$ forming the barrier layer 4 has a bandgap larger than that of $Al_{x1}In_{y1}Ga_{1-x1-y1}N$ forming the channel layer 3.

The heterojunction field effect transistor 800 can be obtained by using a method in which the channel layer 3 and the barrier layer 4 having respective desired compositions are formed by growing the channel layer 3 and the barrier layer 4 while adjusting the flow rate, the pressure, and the temperature (growth conditions) of trimethylindium, trimethylaluminum, trimethylgallium, ammonia, and the like which serve as source gases of $In_zAl_xGa_{1-x-z}N$ (0<x≤1, 0<z≤1), instead of growing the channel layer 3a and the barrier layer 4a described with reference to FIG. 6.

The Ninth Preferred Embodiment

Figure 42:
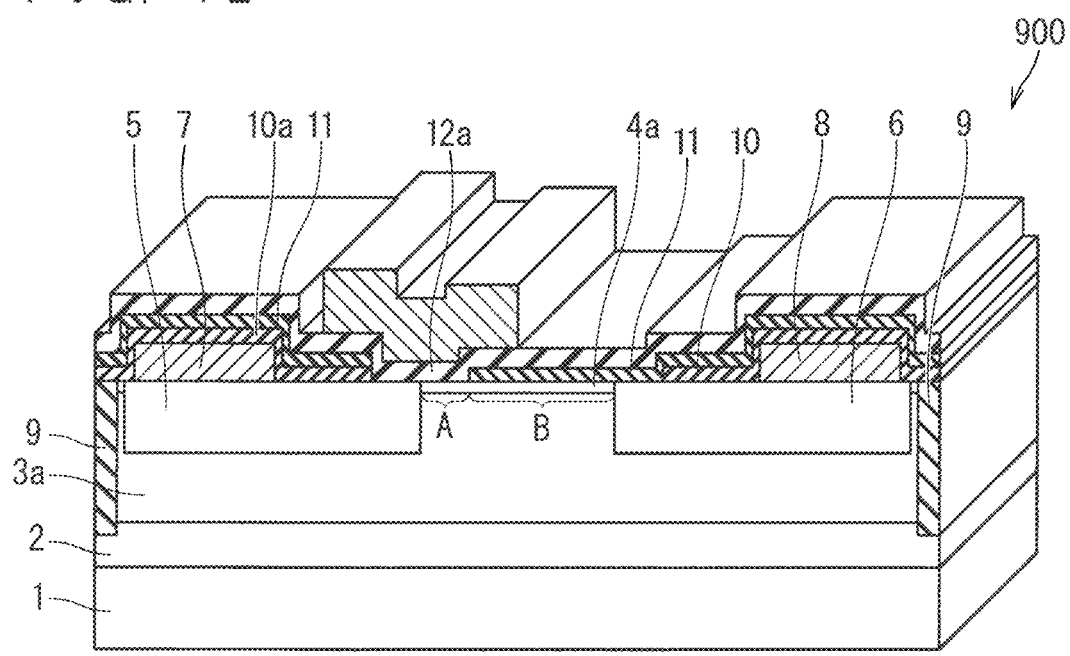
FIG. 42 is a perspective view showing a cross-section structure of a semiconductor device of a ninth preferred embodiment in accordance with the present invention.

FIG. 42 is a perspective view showing a cross-section structure of a heterojunction field effect transistor 900 formed of a nitride semiconductor of the ninth preferred embodiment in accordance with the present invention. Further, in FIG. 42, constituent elements identical to those in the heterojunction field effect transistor 100 described with reference to FIG. 1 are represented by the same reference signs, and redundant description will be omitted.

Though it is assumed that the cap insulating film 10a is formed of $SiN_a$ in the heterojunction field effect transistors of the first to eighth preferred embodiments described above, if desorption of nitrogen from the nitride semiconductor forming the barrier layer can be suppressed when the heat treatment at 700° C. or higher is performed, the cap insulating film does not necessarily need to be formed of $SiN_a$, and as shown in FIG. 42, a cap insulating film 10 formed of an insulating film such as $AlN_d$ (aluminum nitride), $BN_e$ (boron nitride), or the like or a semiconductor film may be used. The heterojunction field effect transistor 900 having such a structure produces the same effects as those produced by the heterojunction field effect transistors of the first to eighth preferred embodiments.

The heterojunction field effect transistor 900 can be obtained by using a method in which the cap insulating film 10 is formed by depositing $AlN_d$ or $BN_e$ by the sputtering method or the like using a target formed of Al or B, instead of depositing the cap insulating film 10a described with reference to FIG. 10.

The Tenth Preferred Embodiment

Figure 43:
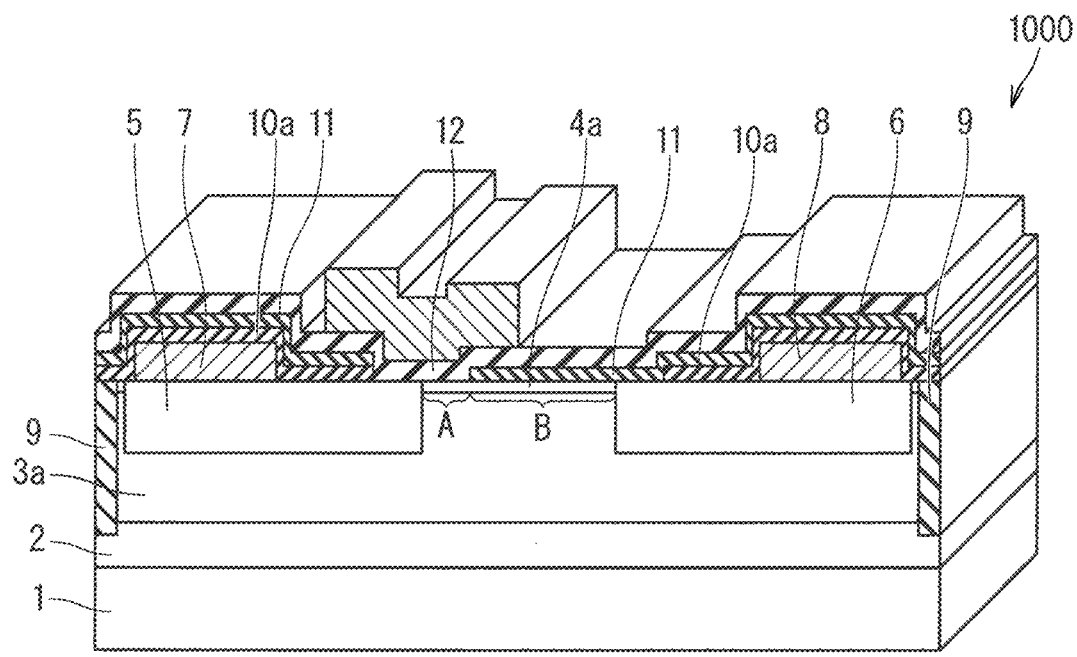
FIG. 43 is a perspective view showing a cross-section structure of a semiconductor device of a tenth preferred embodiment in accordance with the present invention.

FIG. 43 is a perspective view showing a cross-section structure of a heterojunction field effect transistor 1000 formed of a nitride semiconductor of the tenth preferred embodiment in accordance with the present invention. Further, in FIG. 43, constituent elements identical to those in the heterojunction field effect transistor 100 described with reference to FIG. 1 are represented by the same reference signs, and redundant description will be omitted.

Though it is assumed that the gate insulating film 12a is formed of $AlO_c$ in the heterojunction field effect transistors of the first to ninth preferred embodiments described above, in a case where the barrier layer is formed of $Al_{x1}In_{y1}Ga_{1-x1-y1}N$, if the gate insulating film is formed of an insulator or a semiconductor which has a bandgap larger than that of the barrier layer and a material is used by which the positive electric charge formed in the interface with the barrier layer is reduced as compared with $SiO_b$, the gate insulating film does not necessarily need to be formed of $AlO_c$, and as shown in FIG. 43, a gate insulating film 12 formed of, for example, $AlGa_fO_aN_g$ (aluminum gallium oxynitride) may be used.

The heterojunction field effect transistor 1000 having such a structure produces the same effects as those produced by the heterojunction field effect transistors of the first to ninth preferred embodiments.

The heterojunction field effect transistor 1000 can be obtained by using a method in which the gate insulating film 12 is formed by depositing $AlGa_fO_aN_g$ while adjusting the flow rate, the pressure, and the temperature (deposition conditions) of trimethylaluminum, trimethylgallium, oxygen, ozone, nitrogen, and the like which serve as source gases of the gate insulating film, instead of depositing the gate insulating film 12a described with reference to FIG. 14.

The Eleventh Preferred Embodiment

Figure 44:
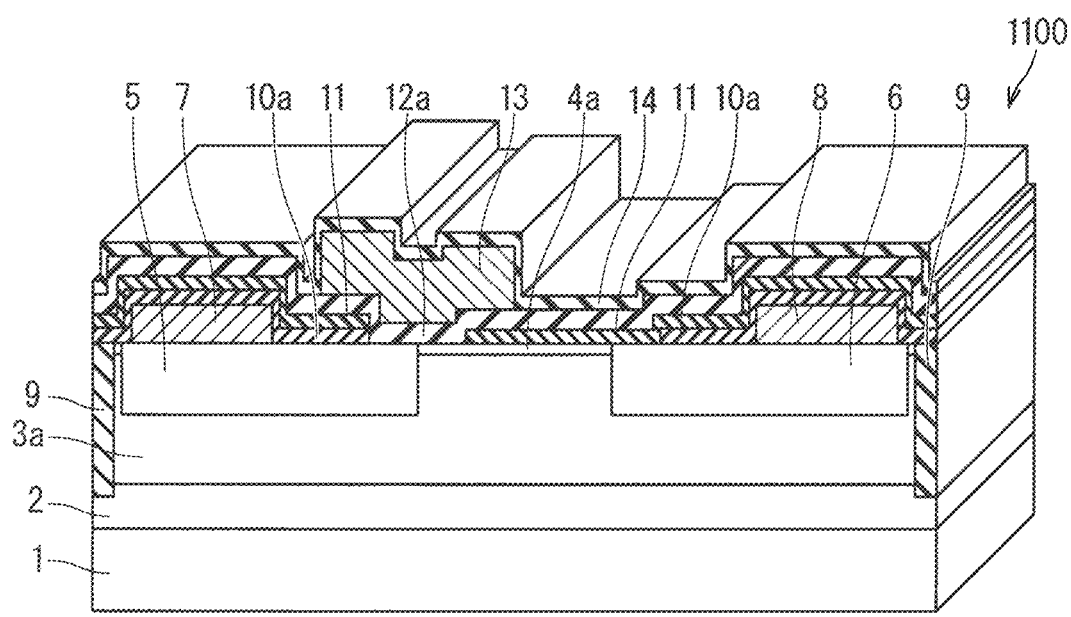
FIG. 44 is a perspective view showing a cross-section structure of a semiconductor device of an eleventh preferred embodiment in accordance with the present invention.

FIG. 44 is a perspective view showing a cross-section structure of a heterojunction field effect transistor 1100 formed of a nitride semiconductor of the eleventh preferred embodiment in accordance with the present invention. Further, in FIG. 44, constituent elements identical to those in the heterojunction field effect transistor 100 described with reference to FIG. 1 are represented by the same reference signs, and redundant description will be omitted.

Though it is assumed that the coating insulating film 14a is formed of $SiN_d$ in the heterojunction field effect transistor of the seventh preferred embodiment described above, if it is possible to suppress the reduction in the positive electric charge induced in the interface between $SiO_b$ and AlGaN, which is caused by the heat treatment after forming the gate insulating film 12, the coating insulating film does not necessarily need to be formed of $SiN_d$, and as shown in FIG. 44, a coating insulating film 14 formed of an insulating film such as $AlN_d$ (aluminum nitride), $BN_e$ (boron nitride), or the like or a semiconductor film may be used. The heterojunction field effect transistor 1100 having such a structure produces the same effects as those produced by the heterojunction field effect transistor of the seventh preferred embodiment.

The heterojunction field effect transistor 1100 can be obtained by using a method in which the coating insulating film 14 is formed by depositing $AlN_d$ or $BN_e$ by the sputtering method or the like using the target formed of Al or B, instead of depositing the coating insulating film 14a described with reference to FIG. 32.

The Twelfth Preferred Embodiment

FIG. 45 is a perspective view showing a cross-section structure of a heterojunction field effect transistor 1200 formed of a nitride semiconductor of the twelfth preferred embodiment in accordance with the present invention. Further, in FIG. 45, constituent elements identical to those in the heterojunction field effect transistor 100 described with reference to FIG. 1 are represented by the same reference signs, and redundant description will be omitted.

Though the channel layer 3 is formed of $Al_{x1}In_{y1}Ga_{1-x1-y1}N$ in the heterojunction field effect transistor 800 of the eighth preferred embodiment shown in FIG. 41, the heterojunction field effect transistor 1200 shown in FIG. 45 includes a channel layer 3b formed of $Al_{x1}Ga_{1-x1}N$ (y1=0), instead of the channel layer 3.

Thus, as compared with the structure including the channel layer 3 formed of $Al_{x1}In_{y1}Ga_{1-x1-y1}N$ containing four elements, by including the channel layer 3b formed of $Al_{x1}Ga_{1-x1}N$, alloy scattering of electrons running the heterointerface between the channel layer 3b and the barrier layer 4a, as carriers, is suppressed, and therefore the electron mobility in the channel formed in the heterointerface is increased, to thereby ensure an increase in the drain current.

Further, when a material having a relatively high Al composition (x1) is used, the bandgap is increased, and therefore it becomes harder to break even when a high voltage is applied and the high voltage operation can be achieved. Though x1 falls in a range of x1<1 in principle in this case, since it is actually necessary to suppress the difference in the Al composition ratio from the barrier layer to several percent, in a case where the barrier layer is formed of AlN, x1 falls in a range from 0.97 to 0.98. Additionally, by adjusting the mobility and the electron concentration to become desired values, x1 and other compositions are determined.

Furthermore, since crystal growth becomes easier when the number of constituent elements in the channel layer is reduced, it becomes easier to reduce defects in crystals, and it is possible to improve the characteristics such as the leakage current, the current collapse, and the like caused by the defects.

Further, paying attention to the number of constituent elements in the channel layer, the heterojunction field effect transistor 100 of the first preferred embodiment shown in FIG. 1 has a structure including the channel layer 3a formed of GaN (x1=0, y1=0). Thus, as compared with the structure including the channel layer 3b formed of $Al_{x1}Ga_{1-x1}N$ containing three elements, by including the channel layer 3a formed of GaN, the alloy scattering is further suppressed, and therefore the electron mobility in the channel formed in the heterointerface is further increased, to thereby ensure a further increase in the drain current. Furthermore, since the crystal growth becomes further easier and impurities which are unintentionally mixed in the channel layer 3a can be reduced, it becomes possible to suppress the current collapse caused by the electronic trap due to these impurities. Further, when the crystal growth becomes further easier, it becomes easier to reduce defects in crystals, and it is possible to improve the characteristics such as the leakage current, the current collapse, and the like caused by the defects.

Furthermore, though the material forming the channel layer has been described in comparison between the structure of FIG. 41 and that of FIG. 45 and between the structure of FIG. 1 and that of FIG. 45 in the present preferred embodiment, it goes without saying that by replacing the channel layer in the other preferred embodiments by the channel layer 3b, it becomes possible to produce the same effects as produced by the heterojunction field effect transistor 1200 of the present preferred embodiment.

The Thirteenth Preferred Embodiment

FIG. 46 is a perspective view showing a cross-section structure of a heterojunction field effect transistor 1300 formed of a nitride semiconductor of the thirteenth preferred embodiment in accordance with the present invention. Further, in FIG. 46, constituent elements identical to those in the heterojunction field effect transistor 100 described with reference to FIG. 1 are represented by the same reference signs, and redundant description will be omitted.

Though the heterojunction field effect transistor 800 shown in FIG. 41 includes the barrier layer 4 formed of $Al_{x2}In_{y2}Ga_{1-x2-y2}N$, the heterojunction field effect transistor 1300 shown in FIG. 46 includes the barrier layer 4a formed of $Al_{x2}Ga_{1-x2}N$ (y2=0), instead of the barrier layer 4.

Thus, by including the barrier layer 4a formed of $Al_{x2}Ga_{1-x2}N$, the alloy scattering of electrons running the heterointerface between the channel layer 3 and the barrier layer 4a, as carriers, is reduced, and therefore the electron mobility in the channel formed in the heterointerface is increased, to thereby ensure an increase in the drain current. Further, since the crystal growth becomes easier when the number of constituent elements in the barrier layer is reduced, it becomes easier to reduce defects in crystals, and it is possible to improve the characteristics such as the leakage current, the current collapse, and the like caused by the defects.

The First Variation

Figure 47:
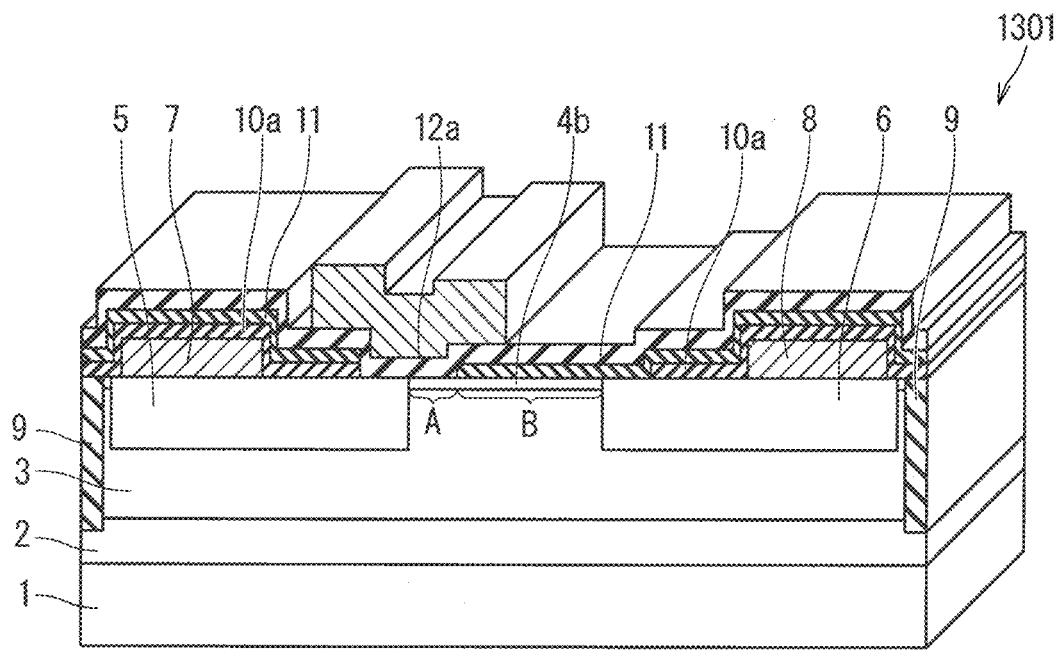
FIG. 47 is a perspective view showing a cross-section structure of a first variation of the semiconductor device of the thirteenth preferred embodiment in accordance with the present invention.

FIG. 47 is a perspective view showing a cross-section structure of a heterojunction field effect transistor 1301 formed of a nitride semiconductor of the first variation of the thirteenth preferred embodiment in accordance with the present invention. Further, in FIG. 47, constituent elements identical to those in the heterojunction field effect transistor 1300 described with reference to FIG. 46 are represented by the same reference signs, and redundant description will be omitted.

Though the heterojunction field effect transistor 800 shown in FIG. 41 includes the barrier layer 4 formed of $Al_{x2}In_{y2}Ga_{1-x2-y2}N$, the heterojunction field effect transistor 1301 shown in FIG. 47 includes a barrier layer 4b formed of $In_{y2}Al_{y2}N$ (x2+y2=1), instead of the barrier layer 4.

Thus, by including the barrier layer 4b formed of $In_{y2}Al_{y2}N$, the alloy scattering of electrons running the heterointerface between the channel layer 3 and the barrier layer 4b, as carriers, is reduced, and therefore the electron mobility in the channel formed in the heterointerface is increased, to thereby ensure an increase in the drain current. Further, since the crystal growth becomes easier when the number of constituent elements in the barrier layer is reduced, it becomes easier to reduce defects in crystals, and it is possible to improve the characteristics such as the leakage current, the current collapse, and the like caused by the defects.

The Second Variation

Figure 48:
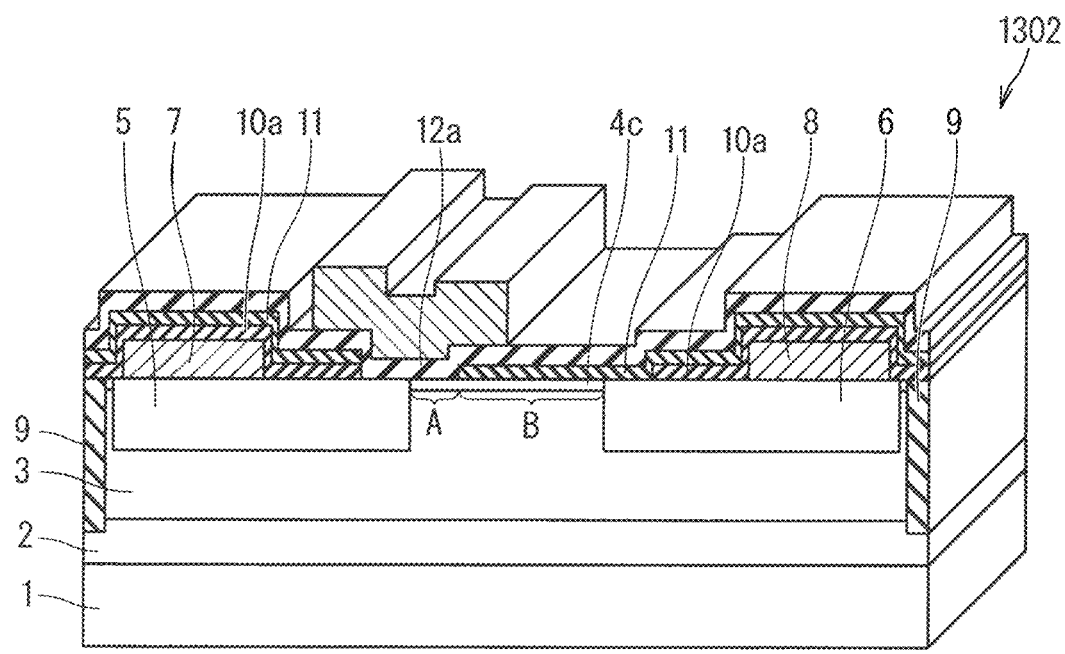
FIG. 48 is a perspective view showing a cross-section structure of a second variation of the semiconductor device of the thirteenth preferred embodiment in accordance with the present invention.

FIG. 48 is a perspective view showing a cross-section structure of a heterojunction field effect transistor 1302 formed of a nitride semiconductor of the second variation of the thirteenth preferred embodiment in accordance with the present invention. Further, in FIG. 48, constituent elements identical to those in the heterojunction field effect transistor 1300 described with reference to FIG. 46 are represented by the same reference signs, and redundant description will be omitted.

Though the heterojunction field effect transistor 800 shown in FIG. 41 includes the barrier layer 4 formed of $Al_{x2}In_{y2}Ga_{1-x2-y2}N$, the heterojunction field effect transistor 1302 shown in FIG. 48 includes a barrier layer 4c formed of AlN (x2=0, y2=0), instead of the barrier layer 4.

Thus, by including the barrier layer 4c formed of AlN, the alloy scattering of electrons running the heterointerface between the channel layer 3 and the barrier layer 4c, as carriers, is further reduced, and therefore the electron mobility in the channel formed in the heterointerface is further increased. Further, since the crystal growth becomes easier when the number of constituent elements in the barrier layer is reduced, it becomes easier to reduce defects in crystals, and it is possible to improve the characteristics such as the leakage current, the current collapse, and the like caused by the defects.

Further, though the material forming the barrier layer has been described in comparison between the structure of FIG. 41 and those of FIGS. 46 to 48 in the present preferred embodiment, it goes without saying that by replacing the barrier layer in the other preferred embodiments by the barrier layer 4b or 4c, it becomes possible to produce the same effects as produced by the heterojunction field effect transistors 1300 to 1302 of the present preferred embodiment.

The Fourteenth Preferred Embodiment

Though only the constituent elements to be noticed in the heterojunction field effect transistors of the first to thirteenth preferred embodiments have been described above, only if the structure operates as a transistor, the following structures can be adopted.

In the case where SiC or Si which is a material different from that of the channel layer is used as the substrate, the buffer layer is needed, but in the case where GaN, AlGaN, or AlInGaN which is the same material as that of the channel layer is used as the substrate, the buffer layer is not necessarily needed. Further, the buffer layer does not necessarily need to be non-doped.

Furthermore, when the four elements, i.e., the channel layer, the barrier layer, the electron supply insulating film, and the gate insulating film are formed on the substrate, the minimum effects described in the first to thirteenth preferred embodiments can be produced, and both the normally-off operation and the high breakdown voltage operation can be achieved.

Further, only the minimum semiconductor layers needed to operate as the transistor in the heterojunction field effect transistors of the first to thirteenth preferred embodiments have been described above, only if the structure operates as the transistor, other semiconductor layers may be formed. For example, a nitride semiconductor layer having a composition different from that of the channel layer or the barrier layer may be formed below the channel layer.

Furthermore, the nitride semiconductor layer other than the channel layer or the barrier layer does not necessarily need to be non-doped, and impurities such as Si, Mg (magnesium), Fe (iron), C, Ge (germanium), or the like may be contained only if the amount thereof causes no problem in the transistor operation.

Further, as the n-type impurity to be doped into the high-concentration n-type impurity region 5 and the high-concentration n-type impurity region 6, an impurity serving as an n-type dopant in the nitride semiconductor, such as Si, Ge, oxygen, nitrogen vacancy, or the like, may be used.

Furthermore, though the cap insulating film 10 is formed above the barrier layer 4, the high-concentration n-type impurity region 5, the high-concentration n-type impurity region 6, the source electrode 7, the drain electrode 8, and the like in the above structure, only if the cap insulating film 10 is formed in a region to achieve the objects of forming the electric field relaxation structure and of protecting the surface of the barrier layer in the heat treatment, which have been described in the first to thirteenth preferred embodiments, the cap insulating film 10 may be formed or may not be formed in the other regions. For example, above the source electrode 7 and the drain electrode 8, the cap insulating film 10 may be formed or may not be formed.

Further, only if the electron supply insulating film 11 of $SiO_b$ is formed on the barrier layer 4 in the drift region B, the electron supply insulating film 11 may be formed or may not be formed in the other region. For example, above the source electrode 7 and the drain electrode 8, the electron supply insulating film 11 may be formed or may not be formed.

Furthermore, the electron supply insulating film 11 of $SiO_b$ does not necessarily need to be formed of one layer, and only if the insulating film which is in contact with the barrier layer 4 is the electron supply insulating film formed of $SiO_b$, the electron supply insulating film 11 may have a structure in which a plurality of layers of different materials such as $AlGa_cO_aN_b$, $AlO_aN_b$, $AlO_a$, $SiO_2$, $Si_3N_4$, or the like are deposited thereon.

Further, if the gate insulating film 12a is formed in at least a region below the gate electrode 13, the gate insulating film 12a may be formed or may not be formed in the other regions. For example, above the source electrode 7 and the drain electrode 8, the gate insulating film 12a may be formed or may not be formed.

Furthermore, the gate insulating film 12a does not necessarily need to be formed of one layer, and only if the insulating film which is in contact with the barrier layer 4 is the insulating film formed of the above material, the gate insulating film 12a may have a structure in which a plurality of layers of different materials such as $AlGa_cO_aN_b$, $AlO_aN_b$, $AlO_a$, $SiO_2$, $Si_3N_4$, or the like are deposited thereon.

Further, if the coating insulating film 14a of $SiN_d$ is formed on the barrier layer 4 in the drift region B or on the gate insulating film 12a in the region ranging from the high-concentration n-type impurity region 5 to the gate electrode, the coating insulating film 14a may be formed or may not be formed in the other regions. For example, above the source electrode 7 and the drain electrode 8, the coating insulating film 14a may be formed or may not be formed.

Furthermore, the coating insulating film 14a of $SiN_d$ does not necessarily need to be formed of one layer, and if the insulating film which is in contact with the gate insulating film 12a is the electron supply insulating film formed of $SiO_b$, the coating insulating film 14a may have a structure in which a plurality of layers of different materials such as $AlGa_cO_aN_b$, $AlO_aN_b$, $AlO_a$, $SiO_2$, $Si_3N_4$, or the like are deposited thereon.

Further, though only the requisite minimum constituent elements needed to operate as the transistor are disclosed in the above description, the device is finally used as a semiconductor device by forming a protection film, a field plate electrode, a wiring, an air bridge, a via hole, and the like.

While the invention has been shown and described in detail, the foregoing description is in all aspects illustrative and not restrictive. It is therefore understood that numerous modifications and variations can be devised without departing from the scope of the invention.

Further, in the present invention, the preferred embodiments may be freely combined, or may be changed or omitted as appropriate, without departing from the scope of the invention.

The invention claimed is:

1. A semiconductor device, comprising:
a substrate;
a channel layer provided on the substrate, being formed of a first nitride semiconductor;
a barrier layer provided in an upper layer portion of the channel layer, being formed of a second nitride semiconductor having a bandgap larger than that of the first nitride semiconductor;
a first impurity region of n-type and a second impurity region of n-type which are provided in the upper layer portion of the channel layer, being spaced each other with the barrier layer interposed therebetween;
a source electrode and a drain electrode which are provided on the first impurity region and the second impurity region, respectively;
a drift region in which an insulating film is provided as to come into contact with the barrier layer on the barrier layer excluding an edge portion of the barrier layer on a side of the source electrode;
a channel region on which the insulating film is not formed, at the edge portion of the barrier layer and at a position away from the second impurity region;
a gate insulating film formed so as to come into contact with the barrier layer and the insulating film respectively on the channel region and the drift region; and
a gate electrode which is provided on the channel region and the gate insulating film on a part of the drift region, wherein the barrier layer in the channel region and the drift region has an identical thickness and composition,
a sheet resistance due to a two-dimensional electron gas generated in an interface between the channel layer and the barrier layer in the channel region is greater than or equal to 10 kΩ/sq, and
the sheet resistance due to the two-dimensional electron gas generated in the interface between the channel layer and the barrier layer in the drift region is less than or equal to 10 kΩ/sq.

2. The semiconductor device according to claim 1, wherein
the channel layer is formed of aluminum indium gallium nitride,
the barrier layer is formed of aluminum gallium nitride,
the insulating film is formed of an silicon oxide film, and
the gate insulating film is formed of aluminum oxide or aluminum gallium oxynitride.

3. The semiconductor device according to claim 1, wherein
in the channel layer and the barrier layer, a doping amount of elements other than major elements forming these layers is at least less than or equal to $1 \times 10^{17}$ $cm^{-3}$.

4. The semiconductor device according to claim 1, wherein
the gate insulating film is so provided as to come into contact with an edge portion of the first impurity region on a side of the barrier layer.

5. The semiconductor device according to claim 1, wherein
the insulating film is so formed as to also come into contact with a partial region of the first impurity region,
the gate insulating film is so provided as to cover a range from an edge portion of the first impurity region on a side of the barrier layer to the insulating film, and
the gate electrode is so provided as to cover the gate insulating film which covers the insulating film.

6. The semiconductor device according to claim 1, comprising:
a cap insulating film which is so provided as to come into contact with at least part of the first impurity region,
wherein the insulating film is also provided on the cap insulating film, and thereon the gate insulating film and the gate electrode are provided, and
the cap insulating film is formed of any one of silicon nitride, aluminum nitride, and boron nitride.

7. The semiconductor device according to claim 6, wherein
the cap insulating film is so formed as to also come into contact with the source electrode and the drain electrode.

8. The semiconductor device according to claim 2, wherein
the channel layer is formed of aluminum gallium nitride.

9. The semiconductor device according to claim 2, wherein
the channel layer is formed of gallium nitride.

10. The semiconductor device according to claim 1, further comprising
a coating insulating film which is so provided as to cover the gate insulating film above at least a region of the barrier layer excluding the edge portion of the barrier layer,
wherein the coating insulating film is formed of any one of silicon nitride, aluminum nitride, and boron nitride.

11. A method of manufacturing a semiconductor device, comprising:
(a) forming a channel layer of a first nitride semiconductor on a substrate;

(b) forming a barrier layer in an upper layer portion of the channel layer, being formed of a second nitride semiconductor having a bandgap larger than that of the first nitride semiconductor;
(c) forming a first impurity region of n-type and a second impurity region of n-type in the upper layer portion of the channel layer, being spaced each other with the barrier layer interposed therebetween;
(d) forming a source electrode and a drain electrode on the first impurity region and the second impurity region, respectively;
(e) so forming an insulating film as to come into contact with the barrier layer on the barrier layer excluding an edge portion of the barrier layer on a side of the source electrode and performing a heat treatment at 700 to 900° C. to form a drift region;
(f) exposing at least the edge portion of the barrier layer to form a channel region;
(g) so forming a gate insulating film as to come into contact with the barrier layer and the insulating film respectively on the channel region and the drift region; and
(h) so forming a gate electrode on the gate insulating film on the channel region and a part of the drift region, wherein the operations (e), (f), (g), and (h) are executed in this order, and the barrier layer in the channel region and the drift region has an identical thickness and composition.

12. The method of manufacturing a semiconductor device according to claim 11, comprising:

so forming a cap insulating film as to cover at least a region of the barrier layer excluding the edge portion of the barrier layer on the side of the source electrode before the operation (e), wherein the cap insulating film is formed of any one of silicon nitride, aluminum nitride, and boron nitride.

13. The method of manufacturing a semiconductor device according to claim 11, further comprising:

(i) so forming a coating insulating film as to cover the gate insulating film above at least a region of the barrier layer excluding the edge portion of the barrier layer after the operation (h); and performing a heat treatment at least at 300° C. after the operation (i), wherein the coating insulating film is formed of any one of silicon nitride, aluminum nitride, and boron nitride.

* * * * *